US011908954B2

United States Patent
Nakatani et al.

(10) Patent No.: US 11,908,954 B2
(45) Date of Patent: Feb. 20, 2024

(54) SEMICONDUCTOR DEVICE WITH INSULATED GATE BIPOLAR TRANSISTOR REGION AND DIODE REGION PROVIDED ON SEMICONDUCTOR SUBSTRATE AND ADJACENT TO EACH OTHER

(71) Applicant: Mitsubishi Electric Corporation, Tokyo (JP)

(72) Inventors: Takahiro Nakatani, Tokyo (JP); Tetsuya Nitta, Tokyo (JP); Kakeru Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/029,162

(22) Filed: Sep. 23, 2020

(65) Prior Publication Data

US 2021/0305240 A1 Sep. 30, 2021

(30) Foreign Application Priority Data

Mar. 26, 2020 (JP) .................................. 2020-056272

(51) Int. Cl.
*H01L 29/861* (2006.01)
*H01L 29/06* (2006.01)
(Continued)

(52) U.S. Cl.
CPC ........ *H01L 29/8613* (2013.01); *H01L 29/063* (2013.01); *H01L 29/1095* (2013.01);
(Continued)

(58) Field of Classification Search
CPC ............. H01L 29/7804; H01L 29/7805; H01L 29/7302; H01L 29/7397; H01L 27/0664
See application file for complete search history.

(56) References Cited

U.S. PATENT DOCUMENTS

2008/0093697 A1 4/2008 Kaneda et al.
2014/0048847 A1* 2/2014 Yamashita .............. H01L 29/36
257/140
(Continued)

FOREIGN PATENT DOCUMENTS

JP 2008-103590 A 5/2008
WO 2014/097454 A1 6/2014
WO 2014/188569 A1 11/2014

OTHER PUBLICATIONS

An Office Action; "Notice of Reasons for Refusal," mailed by the Japanese Patent Office dated Apr. 18, 2023, which corresponds to Japanese Patent Application No. 2020-056272 and is related to U.S. Appl. No. 17/029,162; with English language translation.

*Primary Examiner* — Jesse Y Miyoshi
(74) *Attorney, Agent, or Firm* — Studebaker & Brackett PC

(57) ABSTRACT

A semiconductor device includes an insulated gate bipolar transistor region and a diode region adjacent to each other, wherein the insulated gate bipolar transistor region includes base layers of a second conductive type provided on the first main surface side, emitter layers of the first conductive type selectively provided in a surface layer of the base layer on the first main surface side, multiple gate electrodes provided on the first main surface side of the semiconductor substrate, aligned in a first direction extending along the first main surface, and facing the emitter layer, the base layer, and the drift layer via a gate insulating film, carrier injection suppression layers of the first conductive type selectively provided in a surface layer of the base layer on the first main surface side and sandwiched by the base layers in the first direction.

10 Claims, 16 Drawing Sheets

(51) Int. Cl.
*H01L 29/10* (2006.01)
*H01L 29/66* (2006.01)
*H01L 29/739* (2006.01)
*H01L 29/78* (2006.01)
*H01L 29/73* (2006.01)

(52) U.S. Cl.
CPC .... *H01L 29/66348* (2013.01); *H01L 29/7302* (2013.01); *H01L 29/7397* (2013.01); *H01L 29/7804* (2013.01)

(56) References Cited

U.S. PATENT DOCUMENTS

| | | | | |
|---|---|---|---|---|
| 2014/0070270 | A1* | 3/2014 | Yoshida | H01L 29/7397 257/140 |
| 2015/0295042 | A1* | 10/2015 | Kameyama | H01L 27/0629 257/140 |
| 2016/0071841 | A1* | 3/2016 | Saito | H01L 29/7397 257/140 |

* cited by examiner

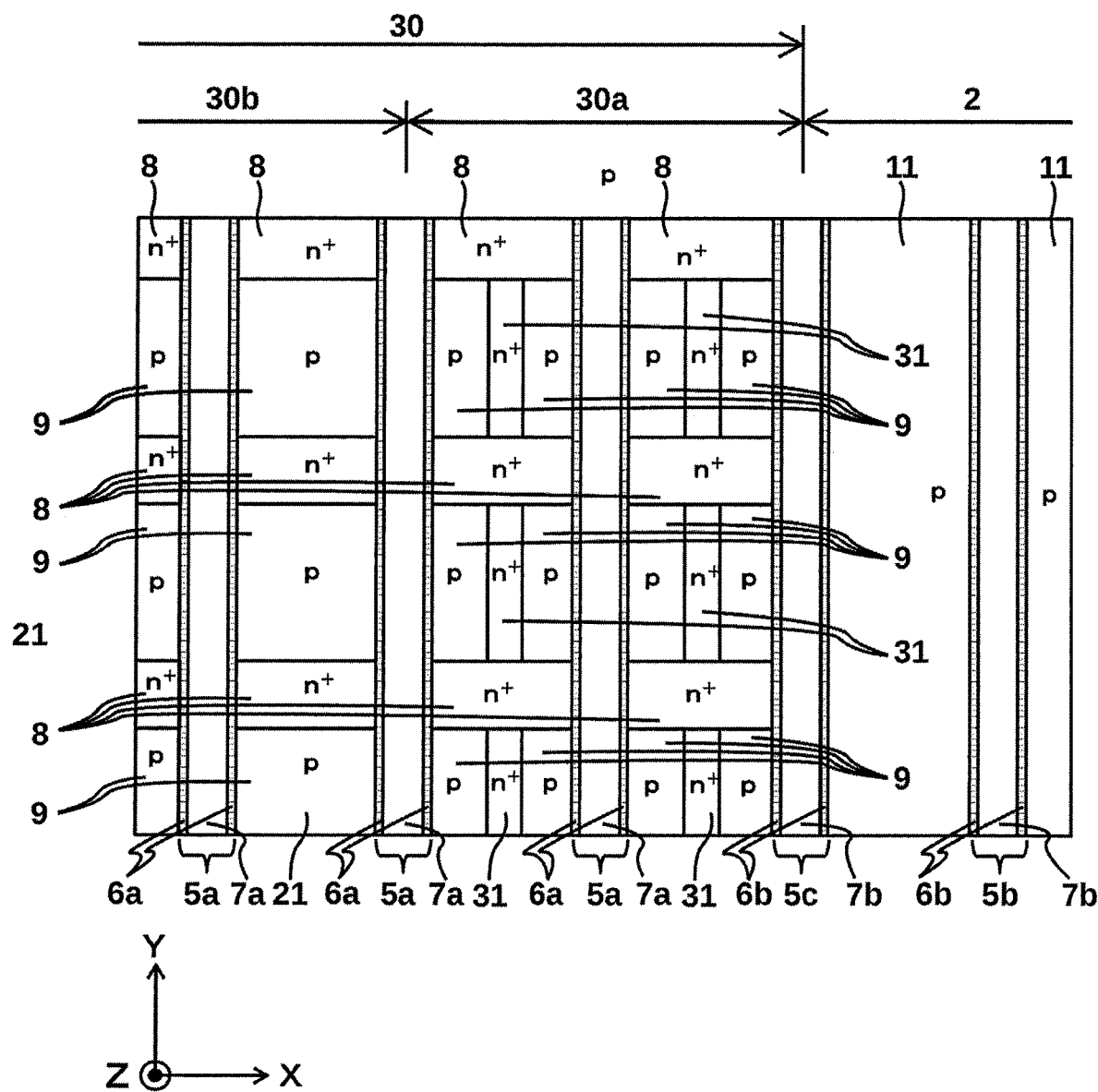

SEMICONDUCTOR DEVICE WITH INSULATED GATE BIPOLAR TRANSISTOR REGION AND DIODE REGION PROVIDED ON SEMICONDUCTOR SUBSTRATE AND ADJACENT TO EACH OTHER

BACKGROUND OF THE INVENTION

Field

The present disclosure relates to a semiconductor device.

Background

From the viewpoint of energy saving, inverter devices are used in a wide range of fields such as home appliances, electric vehicles, and railways. Most of the inverter devices consist of an insulated gate bipolar transistor (IGBT) and a freewheeling diode. The insulated gate bipolar transistor and the diode are connected by wiring such as wires inside the inverter device.

A semiconductor device in which an insulated gate bipolar transistor and a diode are formed on one semiconductor substrate has been proposed for downsizing inverter devices (for example, JP 2008-103590 A).

SUMMARY

However, a semiconductor device in which an insulated gate bipolar transistor and a diode are formed on one semiconductor substrate as described above has a problem in that holes, which are minority carriers, flow from the insulated gate bipolar transistor region to the diode region, so that the recovery current during the recovery operation is higher and the breakdown resistance of the diode is lower than in the case where discrete components, an insulated gate bipolar transistor and a diode, are connected in parallel for use. There is a demand for a semiconductor device having a diode region with high breakdown resistance during recovery operation.

An object of the present disclosure, which has been made to solve the above problem, is to provide a semiconductor device having improved breakdown resistance during recovery operation.

A semiconductor device according to the present disclosure includes: a semiconductor substrate having a drift layer of a first conductive type between a first main surface and a second main surface opposite to the first main surface; and an insulated gate bipolar transistor region and a diode region provided on the semiconductor substrate and adjacent to each other, wherein the insulated gate bipolar transistor region includes base layers of a second conductive type provided in a surface layer of the semiconductor substrate on the first main surface side, emitter layers of the first conductive type selectively provided in a surface layer of the base layer on the first main surface side, multiple gate electrodes provided on the first main surface side of the semiconductor substrate, aligned in a first direction extending along the first main surface, and facing the emitter layer, the base layer, and the drift layer via a gate insulating film, carrier injection suppression layers of the first conductive type selectively provided in a surface layer of the base layer on the first main surface side and sandwiched by the base layers in the first direction between the gate electrodes adjacent to each other in the first direction, and a collector layer of the second conductive type provided in a surface layer of the semiconductor substrate on the second main surface side, and the diode region includes an anode layer of the second conductive type provided in a surface layer of the semiconductor substrate on the first main surface side, and a cathode layer of the first conductive type provided in a surface layer of the semiconductor substrate the second main surface side.

In the present disclosure, the carrier injection suppression layer is provided in the insulated gate bipolar transistor region. Therefore, it is possible to suppress the holes flowing into the diode region and enhance the breakdown resistance during the recovery operation.

Other and further objects, features and advantages of the invention will appear more fully from the following description.

BRIEF DESCRIPTION OF DRAWINGS

FIG. 16 is a plan view showing the semiconductor device according to the second embodiment.

DESCRIPTION OF EMBODIMENTS

Figure 1:
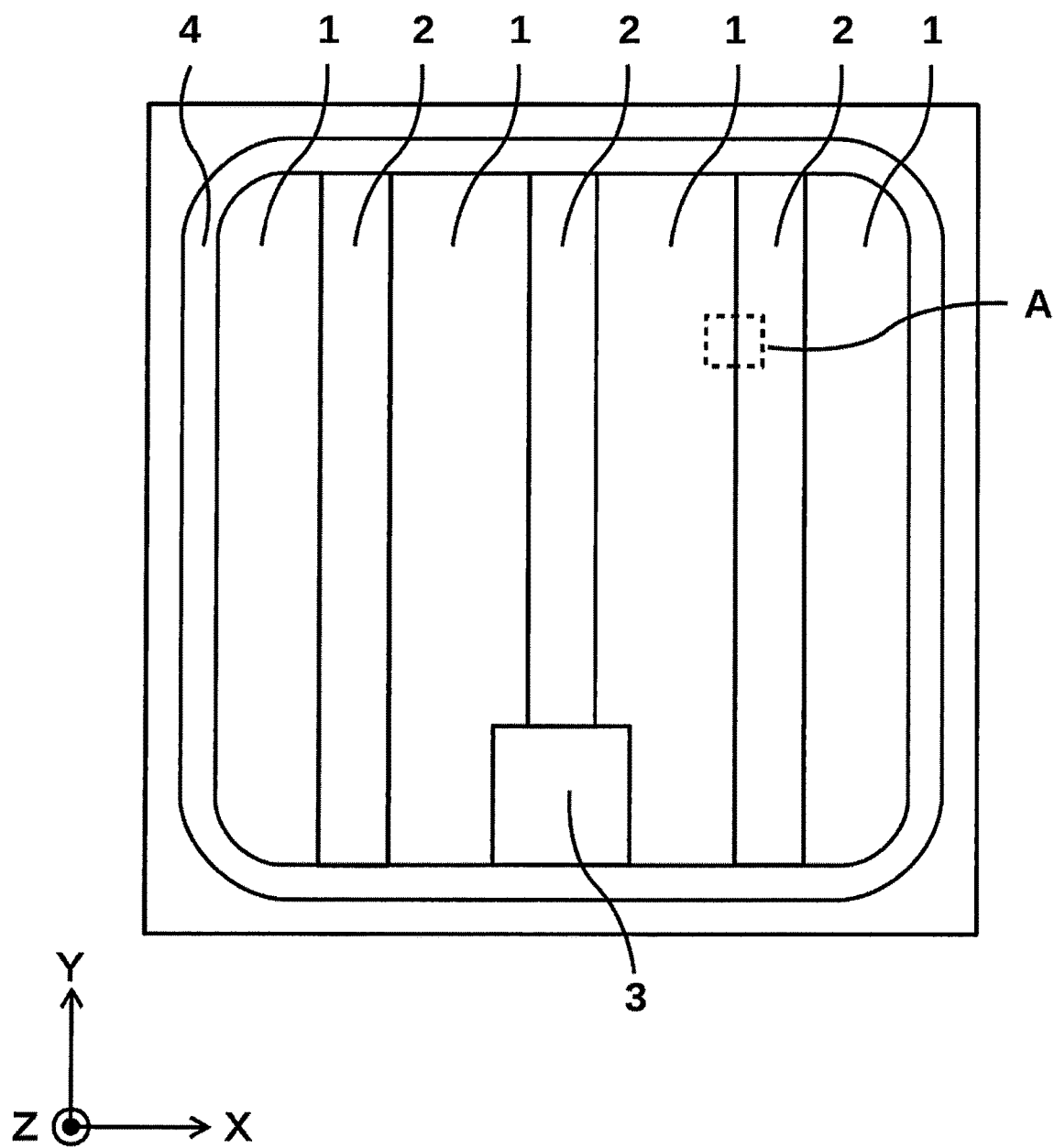
FIG. 1 is a plan view showing the semiconductor device according to a first embodiment.

Embodiments will now be described with reference to the accompanying drawings. Since the drawings are schematic, the interrelationship between size and position may vary. In the following description, the same or corresponding components may be denoted by the same reference numerals, and repeated description may be omitted.

Further, in the following description, terms such as "above", "below", and "side" that mean a specific position and direction may be used, but these terms are used for easy understanding of the contents of the embodiments and do not limit the position and the direction during implementation.

Regarding the semiconductor conductivity type, a description will be given assuming that the first conductivity type is n-type and the second conductivity type is p-type. However, these may be reversed so that the first conductivity type is p-type and the second conductivity type is n-type. The n+ type has a higher donor concentration than the n type, and the n-type has a lower donor concentration than the n type. Similarly, the p+ type has a higher acceptor concentration than the p type, and the p-type has a lower acceptor concentration than the p type.

First Embodiment

Figure 2:
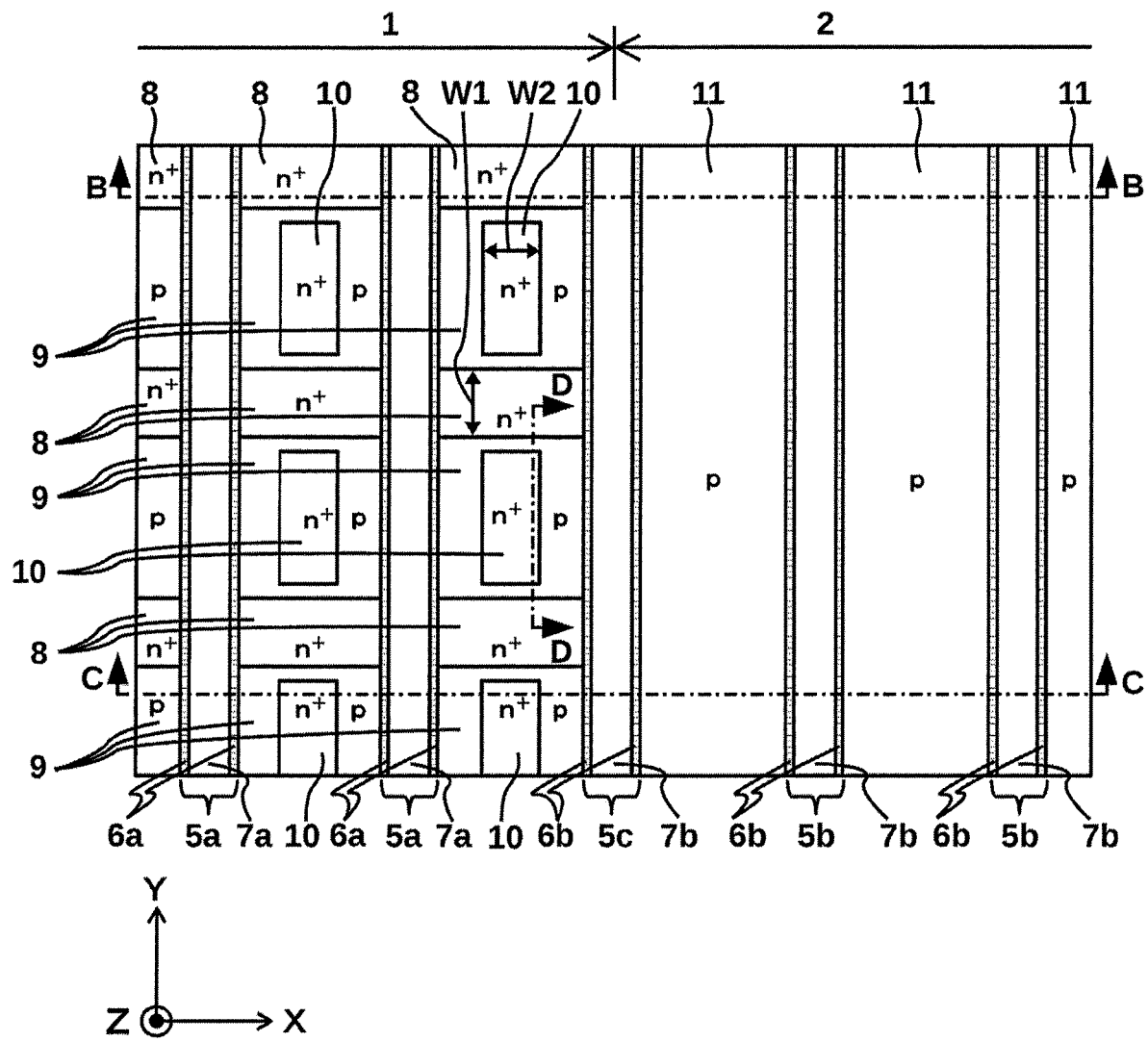
FIG. 2 is a plan view showing the semiconductor device according to the first embodiment.
Figure 3:
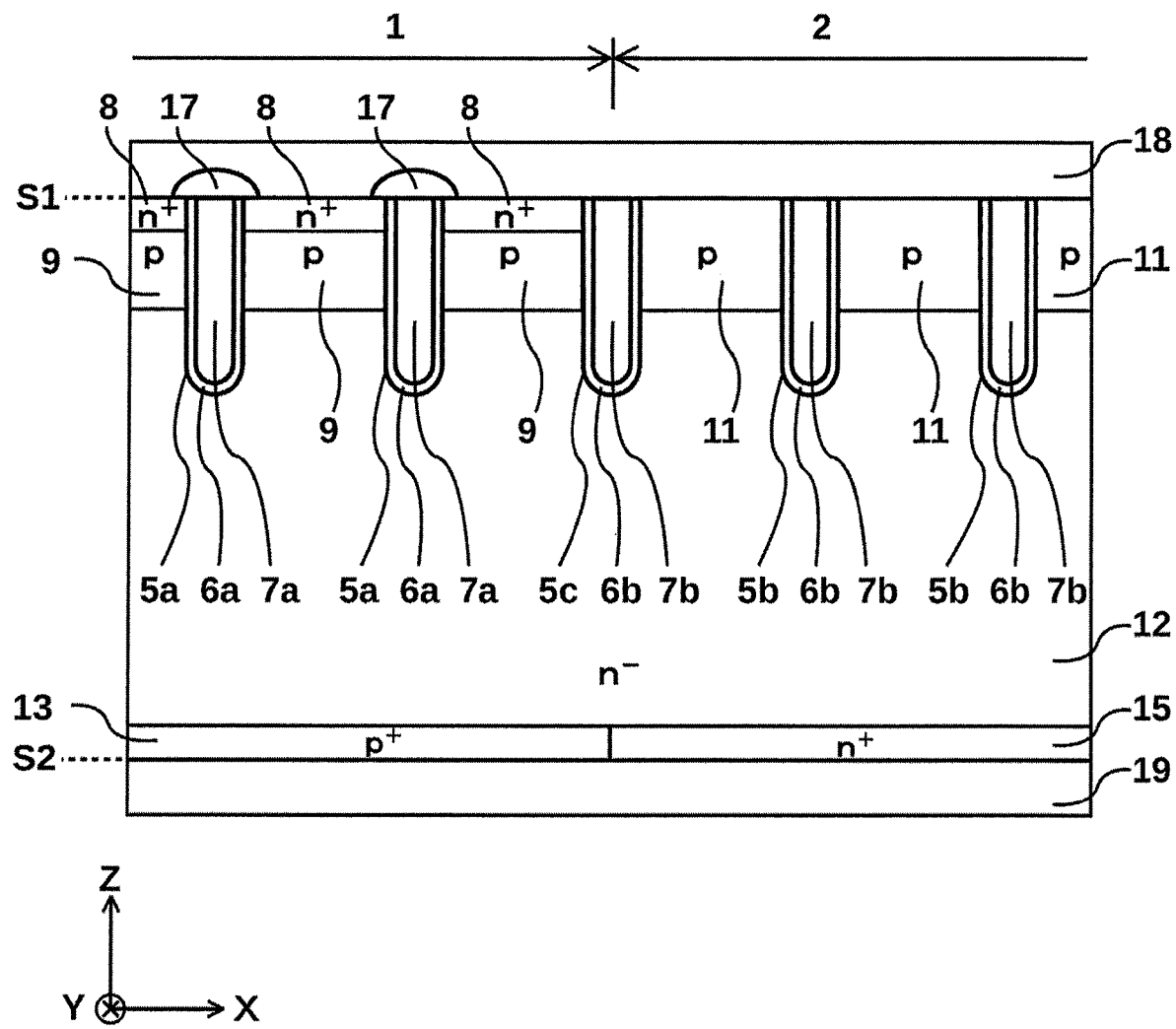
FIG. 3 is a plan view showing the semiconductor device according to the first embodiment.
Figure 4:
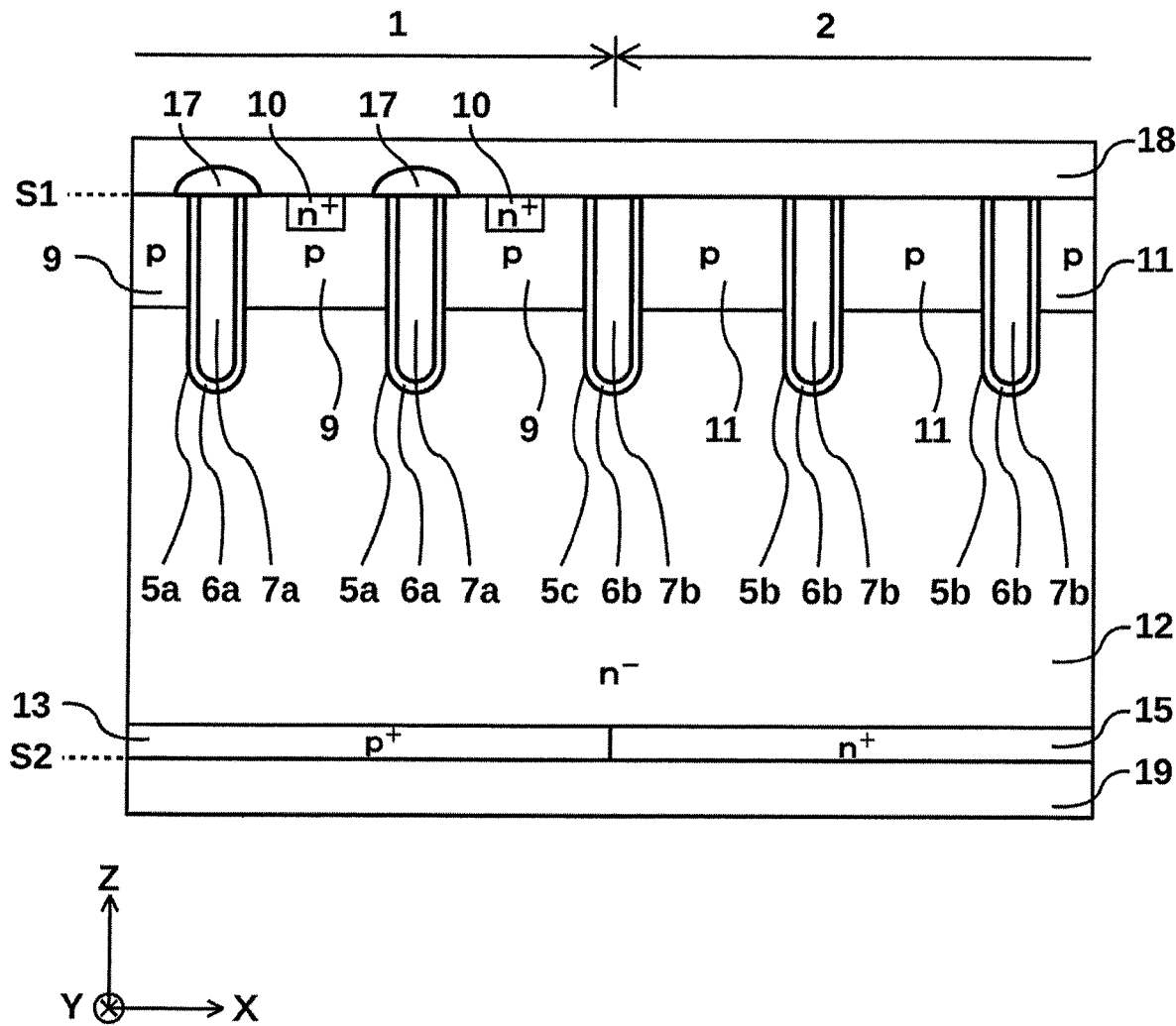
FIG. 4 is a plan view showing the semiconductor device according to the first embodiment.
Figure 5:
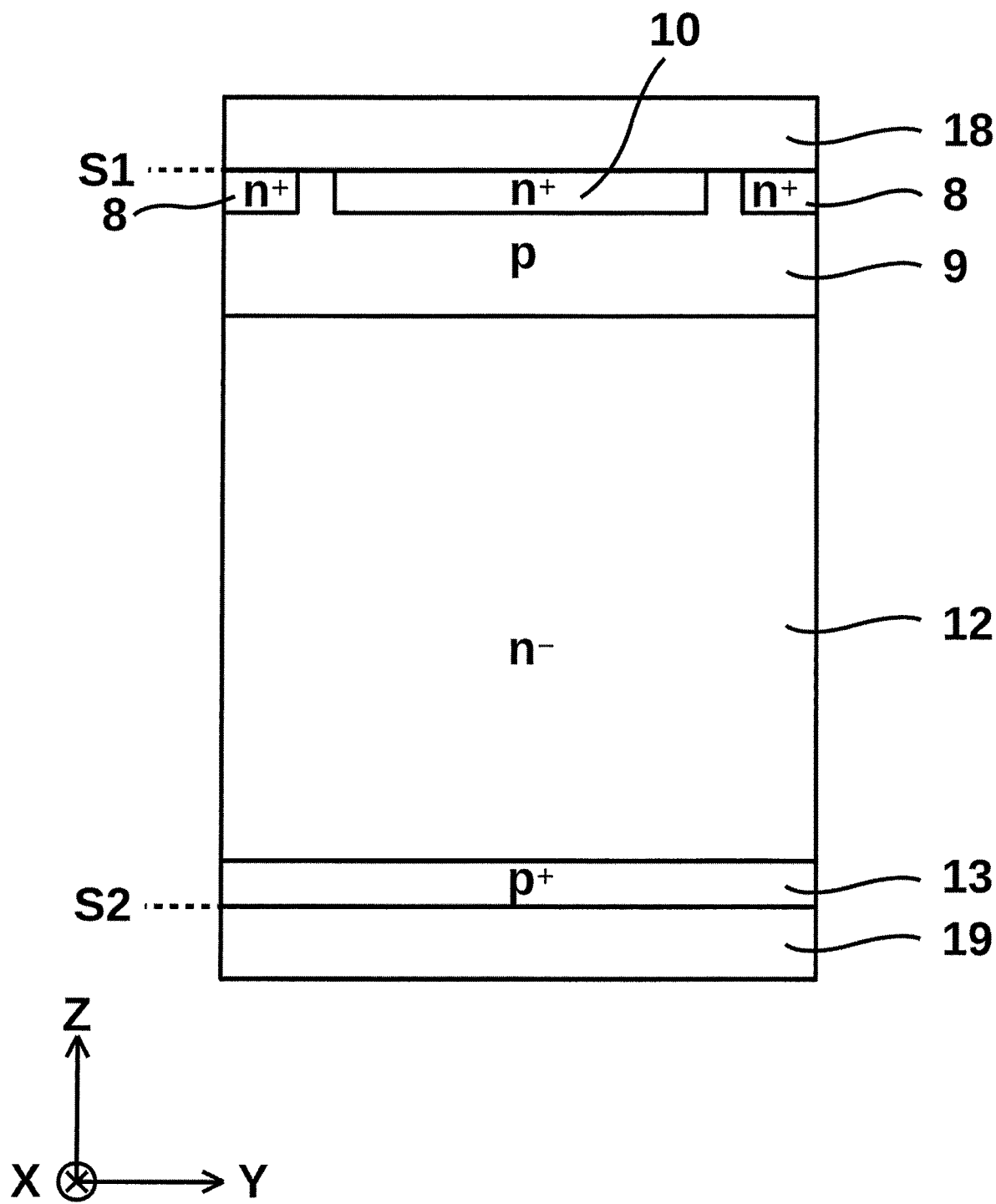
FIG. 5 is a plan view showing the semiconductor device according to the first embodiment.

A configuration of a semiconductor device according to a first embodiment will be described with reference to FIGS. 1 to 5. FIGS. 1 and 2 are plan views showing the semiconductor device according to the first embodiment. FIG. 2 is an enlarged plan view of a portion A shown in FIG. 1, and is a plan view showing the configuration of a first main surface side of a semiconductor substrate. FIG. 2 does not show electrodes and other components provided above the first main surface of the semiconductor substrate. FIGS. 3 to 5 are cross-sectional views showing the semiconductor device according to the first embodiment. FIG. 3 is a cross-sectional view taken along line B-B shown in FIG. 2. FIG. 4 is a cross-sectional view taken along line C-C shown in FIG. 2. FIG. 5 is a cross-sectional view taken along line D-D shown in FIG. 2. FIGS. 1 to 5 also show XYZ orthogonal coordinate axes indicating directions for convenience of explanation.

As shown in FIG. 1, in a semiconductor device 100, an insulated gate bipolar transistor region 1 in which an insulated gate bipolar transistor is formed, and a diode region 2 in which a diode is formed are provided adjacent to each other on one semiconductor substrate. The insulated gate bipolar transistor region 1 and the diode region 2 are striped regions longitudinally extending in the Y direction of the semiconductor device 100, and the insulated gate bipolar transistor region 1 and the diode region 2 are aligned in the X direction of the semiconductor device 100. The insulated gate bipolar transistor region 1 and the diode region 2 are active regions of the semiconductor device 100, and the insulated gate bipolar transistor region 1 and the diode region 2 are placed in the center of the semiconductor device 100 in a plan view.

The semiconductor device 100 has a gate signal receiving region 3. The gate signal receiving region 3 is a region for receiving external electric signals. The insulated gate bipolar transistor region 1 permits switching between the conducting state and the non-conducting state according to electric signals received at the gate signal receiving region 3. The gate signal receiving region 3 is located near the insulated gate bipolar transistor region 1. When the gate signal receiving region 3 is located near the insulated gate bipolar transistor region 1, noise mixed in electric signals can be suppressed and malfunction of the insulated gate bipolar transistor region 1 can be prevented. Wiring for receiving external electrical signals is connected to the gate signal receiving region 3. The wiring may be a wire or lead, for example.

In FIG. 1, the gate signal receiving region 3 is a rectangular region and located with three sides adjacent to the insulated gate bipolar transistor regions 1 and the diode region 2; however, the gate signal receiving region 3 is not necessarily located in this manner. The gate signal receiving region 3 is located at least near the insulated gate bipolar transistor region 1 and the diode region 2 that are the active regions, and may be located in the middle of the active regions so that its four sides are all adjacent to the insulated gate bipolar transistor regions 1 and the diode region 2, or may be located at a corner of the active regions so that only two of the four sides are adjacent thereto. The gate signal receiving region 3 is not necessarily located in this manner, and is located at least in a region surrounded by a terminal region 4 surrounding the active regions in a plan view.

A terminal region 4 surrounds the insulated gate bipolar transistor region 1, the diode region 2, and the gate signal receiving region 3 in a plan view. In order to retain the withstand voltage of the semiconductor device 100, the terminal region 4 has a withstand voltage retaining structure such as a field limiting ring (FLR) or reduced surface field (RESURF) structure.

As shown in FIG. 2, multiple trenches 5a are provided on the upper surface side of the insulated gate bipolar transistor region 1, one trench 5c is provided at the boundary between the insulated gate bipolar transistor region 1 and the diode region 2, and multiple trenches 5b are provided at the top of the diode region 2. The trenches 5a, 5b, and 5c are grooves formed on the first main surface side of the semiconductor substrate by etching or the like. Multiple trenches 5a, 5b, and 5c are aligned in the X direction, which is a first direction, and longitudinally extend in the Y direction, which is a second direction orthogonal to the first direction. A gate insulating film 6a is provided on the sidewall of each trench 5a. A gate insulating film 6b is provided on the sidewall of each trench 5b and the trench 5c. A conductive gate electrode 7a is provided inside the gate insulating film 6a of each trench 5a, and a conductive gate electrode 7b is provided inside the gate insulating film 6b of each trench 5b and the trench 5c. Multiple gate electrodes 7a and gate electrodes 7b longitudinally extend in the Y direction and are aligned in the X direction.

An n-type emitter layer 8 having a higher donor concentration than a drift layer (not shown in FIG. 2), an n-type carrier injection suppression layer 10 having a higher donor concentration than a drift layer, and a p-type base layer 9 are provided in the surface layer of the semiconductor substrate between the adjacent trenches 5a in the insulated gate bipolar transistor region 1 and in the surface layer of the semiconductor substrate between the adjacent trenches 5a and 5c. The emitter layer 8 is in contact with the gate insulating films 6a in the X direction. Meanwhile, the carrier injection suppression layers 10 are sandwiched between the base layers 9, between the gate electrodes 7a adjacent to each other in the X direction, and between the gate electrodes 7a and 7b adjacent to each other in the X direction, and are not in contact with the gate insulating films 6a. The emitter layers 8 longitudinally extending in the X direction and laterally extending in the Y direction. The carrier injection suppression layers 10 longitudinally extending in the Y direction and laterally extending in the X direction. The carrier injection suppression layers 10 are sandwiched between the emitter layers 8 in the Y direction.

In a plan view, a width of the carrier injection suppression layer 10 in the lateral direction, that is, a width W2 of the carrier injection suppression layer 10 in the X direction is preferably less than or equal to a width of the emitter layer 8 in the lateral direction, that is, a width W1 of the emitter layer 8 in the Y direction. With the carrier injection suppression layers 10, when the insulated gate bipolar transistor region 1 has been switched from the conducting state to the non-conducting state, latch-up may occur just below the carrier injection suppression layers 10 and the current interruption performance may be thus deteriorated. However, when the width of each of the carrier injection suppression layers 10 and the emitter layers 8 in the lateral direction satisfies the aforementioned relationship, the risk that latch-up occurs just below the carrier injection suppression layers 10 can be made lower than or equal to the risk that latch-up occurs just below the emitter layers 8.

The risk that latch-up occurs just below the emitter layers 8 has been studied. When the risk that latch-up occurs just below the carrier injection suppression layers 10 is made lower than or equal to the risk that latch-up occurs just below the emitter layers 8, a drop in latch-up tolerance can be suppressed compared to an insulated gate bipolar transistor with a common vertical structure. However, when adequately high current interruption performance can be maintained, the widths of the carrier injection suppression layers 10 and the emitter layers 8 in the lateral direction do not necessarily need to satisfy the aforementioned relationship.

A p-type anode layer 11 is provided in the surface layer of the semiconductor substrate between the adjacent trenches 5c and 5b in the diode region 2 and in the surface layer of the semiconductor substrate between the adjacent trenches 5b.

As shown in FIG. 3, the insulated gate bipolar transistor region 1 and the diode region 2 are provided on a common semiconductor substrate. The semiconductor substrate is made of silicon, for example. The semiconductor substrate has a first main surface S1 on the side of the Z plus direction, and has a second main surface S2 opposite to the first main surface, on the side of the Z minus direction with respect to the first main surface S1. The X direction and the Y direction extend along the first main surface S1, and the Z direction is orthogonal to the first main surface S1. The semiconductor substrate has a drift layer 12 between the first main surface S1 and the second main surface S2. The drift layer 12 is provided across both the insulated gate bipolar transistor region 1 and the diode region 2. The drift layer 12 is a semiconductor layer having, for example, arsenic or phosphorus as a donor, and a donor concentration in the range of $1.0E+12/cm^3$ to $1.0E+16/cm^3$.

In the insulated gate bipolar transistor region 1, each base layer 9 is provided on the first main surface S1 side of the semiconductor substrate. Each emitter layer 8 is provided in the surface layer of the base layer 9. The emitter layer 8 is a semiconductor layer having, for example, arsenic or phosphorus as a donor, and a donor concentration in the range of $1.0E+17/cm^3$ to $1.0E+20/cm^3$. The base layer 9 is a semiconductor layer having, for example, boron or aluminum as an acceptor, and an acceptor concentration in the range of $1.0E+15/cm^3$ to $1.0E+18/cm^3$.

On the first main surface S1 side of the insulated gate bipolar transistor region 1, trenches are provided passing through the emitter layer 8 and the base layer 9 and reaching the drift layer 12. Each gate electrode 7a faces the emitter layer 8, the base layer 9, and the drift layer 12 via the gate insulating film 6a. A first electrode 18 is provided on the side of the Z plus direction of the gate electrodes 7a with interlayer insulating films 17 therebetween. Each gate electrode 7a is electrically insulated from the first electrode 18 by the interlayer insulating film 17. The gate electrode 7a, which is electrically connected to the gate signal receiving region 3 shown in FIG. 2, receives electrical signals through the gate signal receiving region 3 and is controlled so that its voltage changes according to electrical signals. The gate electrode 7a is an electrode also called an active gate electrode.

When a positive voltage is applied to the gate electrode 7a, an n-type channel (not shown in the drawing) is formed in the base layer 9 in a position in contact with the gate insulating film 6a. Since each emitter layer 8 is in contact with the gate insulating film 6a, the emitter layer 8 and the drift layer 12 are connected through the n-type channel, and the insulated gate bipolar transistor region 1 is switched to the conducting state. When a positive voltage is not applied to the gate electrode 7a, an n-type channel is not formed in the base layer 9, so that the insulated gate bipolar transistor region 1 is switched to the non-conducting state. The electric connection between each gate electrode 7a and the gate signal receiving region 3 is established by wiring (not shown in the drawing) such as aluminum, for example, on the first main surface S1 side in another cross section.

The first electrode 18 is composed of, for example, aluminum or an aluminum alloy. The first electrode 18 is provided on the side of the Z plus direction of the emitter layers 8 and is electrically connected to the emitter layers 8. Aluminum and aluminum alloys are metals having low contact resistance with p-type semiconductor layers and high contact resistance with n-type semiconductor layers. Accordingly, when the first electrode 18 is composed of aluminum or an aluminum alloy, the first electrode 18 is not directly connected to the n-type emitter layers 8, and titanium having low contact resistance with n-type semiconductor layers may be brought in contact with the emitter layers 8 to establish electrical connection between the emitter layers 8 and the first electrode 18 through titanium.

In the insulated gate bipolar transistor region 1, a p-type collector layer 13 having a higher acceptor concentration than the base layer 9 is provided on the second main surface S2 side of the semiconductor substrate. The collector layer 13 is a semiconductor layer having, for example, boron or aluminum as an acceptor, and an acceptor concentration in the range of $1.0E+16/cm^3$ to $1.0E+20/cm^3$. A second electrode 19 is provided on the side of the Z minus direction of the collector layer 13, and the collector layer 13 and the second electrode 19 are electrically connected.

In the diode region 2, the anode layer 11 is provided on the first main surface S1 side of the semiconductor substrate. The anode layer 11 is a semiconductor layer having, for example, boron or aluminum as an acceptor, and an acceptor concentration in the range of $1.0E+15/cm^3$ to $1.0E+18/cm^3$.

Trenches 5b are provided on the first main surface S1 side of the diode region 2. Each trench 5b passes through the anode layer 11 and reaches the drift layer 12. Each gate electrode 7b faces the anode layer 11 and the drift layer 12 via the gate insulating film 6b. The first electrode 18 is provided on the side of the Z plus direction of the gate electrodes 7b. The gate electrodes 7b and the first electrode 18 are electrically connected. Unlike the gate electrodes 7a, the voltage of the gate electrodes 7b are not changed by the gate signal receiving region 3. The first electrode 18 is provided on the side of the Z plus direction of the anode layer 11 and is electrically connected to the anode layer 11. The gate electrode 7b is an electrode also called a dummy gate electrode.

In the diode region 2, an n-type cathode layer 15 having a higher donor concentration than the drift layer 12 is provided on the second main surface S2 side of the semiconductor substrate. The cathode layer 15 is a semiconductor layer having, for example, arsenic or phosphorus as a donor, and a donor concentration in the range of $1.0E+16/cm^3$ to $1.0E+20/cm^3$. The second electrode 19 is provided on the side of the Z minus direction of the cathode layer 15. The second electrode 19 is electrically connected to the cathode layer 15.

A trench 5c is provided at the boundary between the insulated gate bipolar transistor region 1 and the diode region 2 and on the first main surface S1 side. The trench 5c passes through the emitter layer 8, the anode layer 11, and the base layer 9 and reaches the drift layer 12. Each gate electrode 7b faces the emitter layer 8, the base layer 9, and the drift layer 12 via the gate insulating film 6b. A first electrode 18 is provided on the side of the Z plus direction of the gate electrode 7b, and the gate electrode 7b and the first electrode 18 are electrically connected.

As shown in FIG. 4, in the insulated gate bipolar transistor region 1, carrier injection suppression layers 10 are provided in the surface layer of the base layer 9. Each carrier injection suppression layer 10 is a semiconductor layer having, for example, arsenic or phosphorus as a donor, and a donor concentration in the range of $1.0E+17/cm^3$ to $1.0E+20/cm^3$.

The carrier injection suppression layers 10 are sandwiched between the base layers 9 in the X direction, and are not in contact with the gate insulating films 6a. Accordingly, even if a positive voltage is applied to the gate electrodes 7a, the carrier injection suppression layers 10 and the drift layer 12 are not connected because of the n-type channel. In particular, the carrier injection suppression layers 10 are semiconductor layers that do not contribute to switching between the conducting state and the non-conducting state of the insulated gate bipolar transistor region 1.

As shown in FIG. 5, the emitter layers 8 and the carrier injection suppression layer 10 are selectively provided in the surface layer of the base layer 9.

Figure 6:
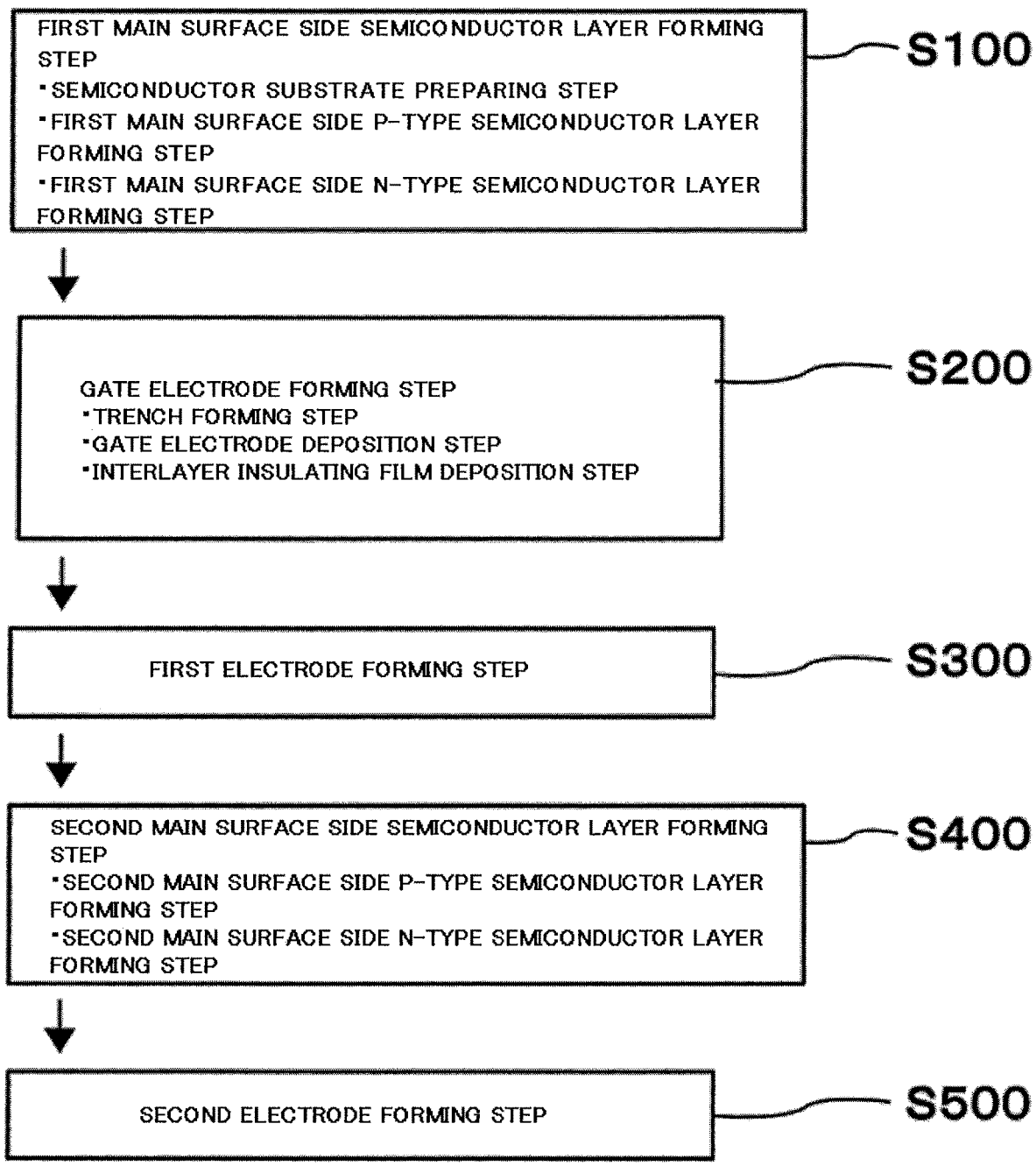
FIG. 6 is a flowchart of manufacturing of the semiconductor device according to the first embodiment.

A method for manufacturing the semiconductor device according to the first embodiment will now be described. FIG. 6 is a flowchart of manufacturing of the semiconductor device according to the first embodiment. The manufacturing method will be explained following the order of the manufacturing flowchart. In the following explanation of the manufacturing method, a method for manufacturing active regions is mentioned and methods for manufacturing the terminal region 4 and the gate signal receiving region 3 which are made in arbitrary structures are not mentioned.

As shown in FIG. 6, the semiconductor device according to the first embodiment is manufactured by a first main surface side semiconductor layer forming step (S100), a gate electrode forming step (S200), a first electrode forming step (S300), a second main surface side semiconductor layer forming step (S400), and a second electrode forming step (S500). The first main surface side semiconductor layer forming step (S100) includes a semiconductor substrate preparing step, a first main surface side p-type semiconductor layer forming step, and a first main surface side n-type semiconductor layer forming step. The gate electrode forming step (S200) includes a trench forming step, a gate electrode deposition step, and an interlayer insulating film deposition step. The second main surface side semiconductor layer forming step (S400) includes a second main surface side p-type semiconductor layer forming step and a second main surface side n-type semiconductor layer forming step.

FIGS. 7 to 10 are diagrams showing a process for manufacturing the semiconductor device according to the first embodiment. FIGS. 7 to 10 are diagrams showing cross sections taken along line C-C shown in FIG. 2 in the manufacturing process.

Figure 7A:
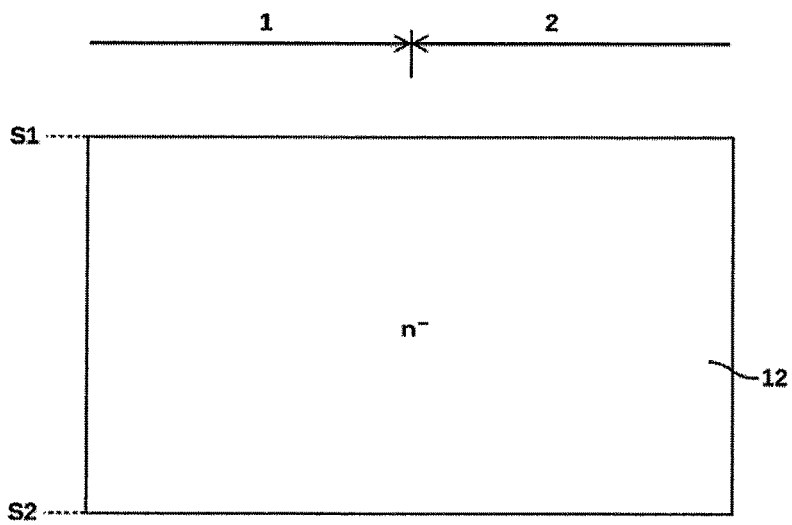
FIG. 7A is a diagram showing a process for manufacturing the semiconductor device according to the first embodiment.
Figure 7B:
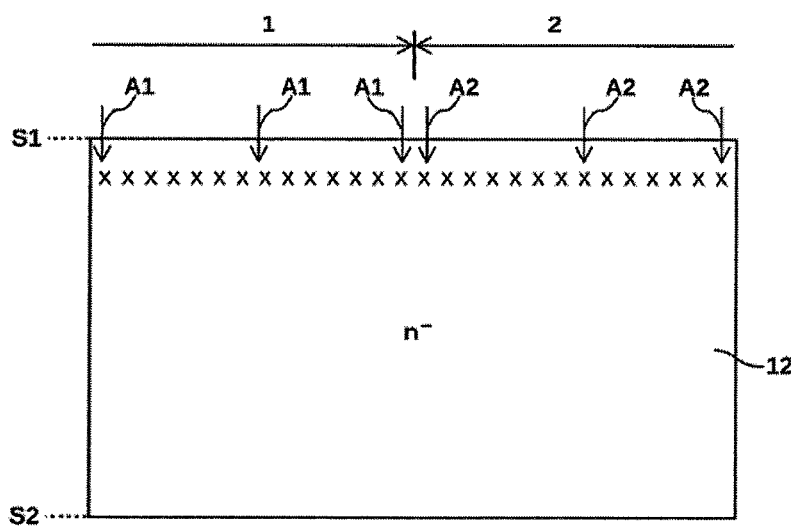
FIG. 7B is a diagram showing a process for manufacturing the semiconductor device according to the first embodiment.
Figure 7C:
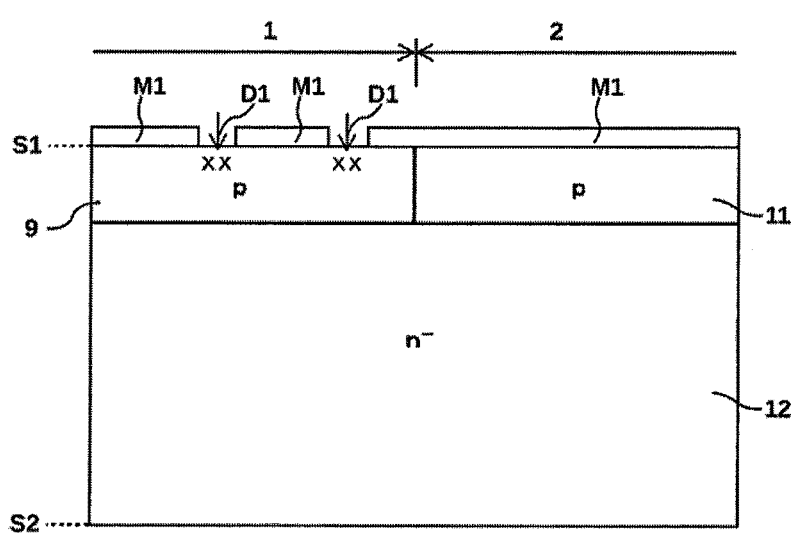
FIG. 7C is a diagram showing a process for manufacturing the semiconductor device according to the first embodiment.

FIGS. 7A, 7B and 7C are diagrams showing the manufacturing process in the first main surface side semiconductor layer forming step. FIG. 7A is a diagram showing the state where the semiconductor substrate preparing step has been completed. The semiconductor substrate preparing step is a step of preparing an n-type semiconductor substrate having a low donor concentration. Since the donor concentration of the drift layer 12 is the donor concentration of the semiconductor substrate, the semiconductor substrate is prepared considering the donor concentration of the drift layer 12. Upon completion of the semiconductor substrate preparing step, the insulated gate bipolar transistor region 1 and the diode region 2 have only the drift layer 12.

FIG. 7B is a diagram showing the manufacturing process in the first main surface side p-type semiconductor layer forming step. The first main surface side p-type semiconductor layer forming step is a step of forming the base layer 9 and the anode layer 11. The base layer 9 is formed by injecting an acceptor A1 into the insulated gate bipolar transistor region 1 from the first main surface S1 side. The anode layer 11 is formed by injecting an acceptor A2 into the diode region 2 from the first main surface S1 side. The acceptor A1 and the acceptor A2 are, for example, boron or aluminum. The acceptor A1 and the acceptor A2 can be the same. When the acceptor A1 and the acceptor A2 are the same, acceptor switching is unnecessary.

When the acceptor A1 and the acceptor A2 are the same and their injection amount are the same, the acceptor A1 and the acceptor A2 can be injected at the same time. The injected acceptor A1 and acceptor A2 are diffused by heating, thereby forming the base layer 9 and the anode layer 11. The acceptor A1 and the acceptor A2 may be heated concurrently.

FIG. 7C is a diagram showing the manufacturing process in the first main surface side n-type semiconductor layer forming step. The first main surface side n-type semiconductor layer forming step is a step of forming the carrier injection suppression layer 10. The carrier injection suppression layer 10 is formed by injecting a donor D1 into the insulated gate bipolar transistor region 1 from the first main surface S1 side. Arsenic, phosphorus, or the like is used as the donor D1.

The carrier injection suppression layer 10 is formed by selectively injecting the donor D1 into the surface layer of the base layer 9. To selectively form the carrier injection suppression layer 10, the donor D1 may be selectively injected using a first main surface side donor injection mask M1. The first main surface side donor injection mask M1 is, for example, a resist mask formed by applying a resist on the first main surface S1 to prevent donor transmission. The first main surface side donor injection mask M1 is provided in a position where the donor D1 is not injected, and is removed after the donor D1 is injected. The injected donor D1 is diffused by heating, thereby forming the carrier injection suppression layer 10.

In the first main surface side semiconductor layer forming step, the emitter layers 8 shown in FIG. 5 are formed in a cross section different from the cross section shown in FIGS. 7A, 7B and 7C. Like the carrier injection suppression layer 10, the emitter layers 8 are formed by selectively injecting a donor into the surface layer of the base layer 9. When the donor used to form the emitter layers 8 and the donor D1 used to form the carrier injection suppression layer 10 are supposed to be the same and their donor concentrations are the same, one first main surface side donor injection mask may be used to concurrently inject the donors for the emitter layers 8 and the carrier injection suppression layer 10, which simplifies the manufacturing process.

When different donors are used for the emitter layers 8 and the carrier injection suppression layer 10 or when different donor concentrations are adopted, the donor for the emitter layers 8 and the donor D1 for the carrier injection suppression layer 10 may be injected separately. In this case, a first main surface side donor injection mask should be formed twice, and the donors may be selectively injected into the portions coinciding with the respective semiconductor layers.

Figure 8A:
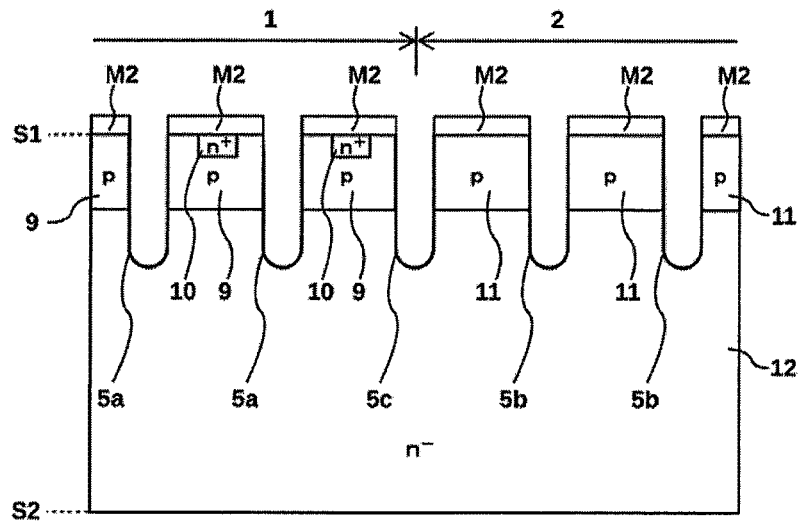
FIG. 8A is a diagram showing a process for manufacturing the semiconductor device according to the first embodiment.
Figure 8B:
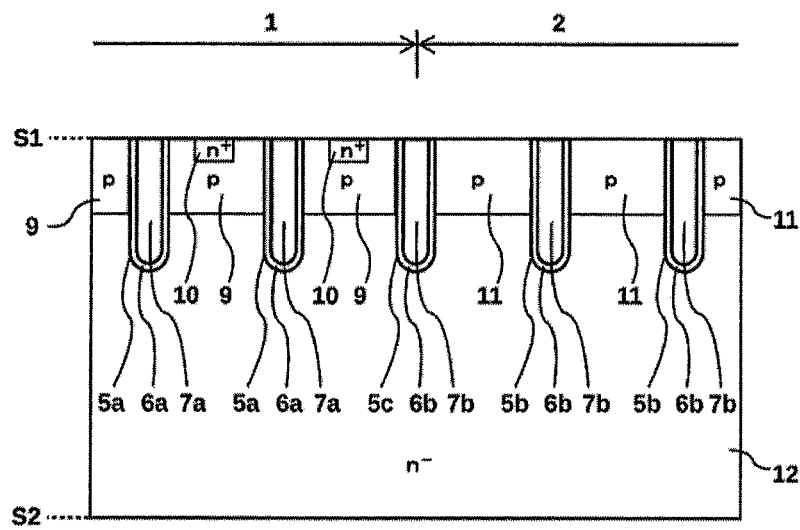
FIG. 8B is a diagram showing a process for manufacturing the semiconductor device according to the first embodiment.
Figure 8C:
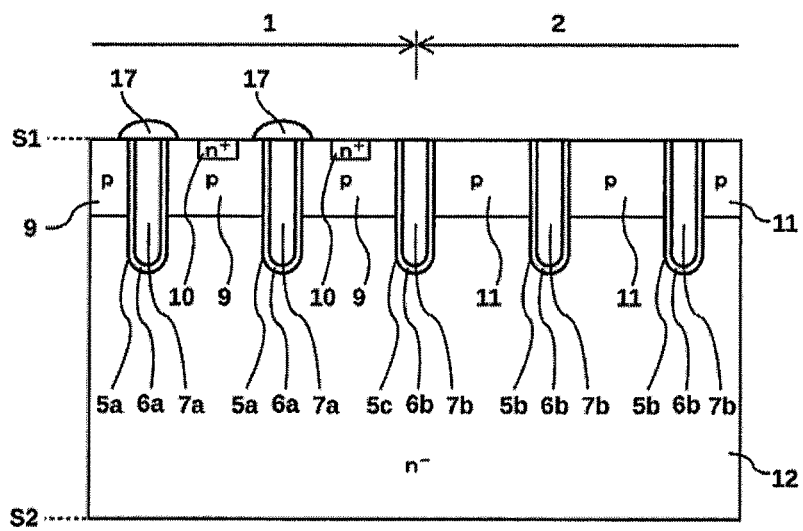
FIG. 8C is a diagram showing a process for manufacturing the semiconductor device according to the first embodiment.

FIGS. 8A, 8B and 8C are diagrams showing the manufacturing process in the gate electrode forming step.

FIG. 8A is a diagram showing the manufacturing process in the trench forming step. The trench forming step is a step of forming trenches 5a, 5b, and 5c on the first main surface S1 side by etching. Before etching, a trench mask M2 is formed in portions where the trenches 5a, 5b, and 5c are not to be formed. The trench mask M2 is, for example, a mask consisting of an oxide film formed on the first main surface S1 by heating, and is removed after the trenches are formed.

FIG. 8B is a diagram showing the manufacturing process in the gate electrode deposition step. The gate electrode deposition step is a step of forming the gate electrodes 7a in the trenches 5a, and the gate electrodes 7b in the trenches 5b and 5c by deposition. First, an oxide film is formed on the surface of the semiconductor substrate including the sidewalls of the trenches 5a, 5b, and 5c by heating. After the oxide film is formed, the gate electrodes 7a and the gate electrodes 7b are formed by deposition from the first main surface S1 side. The gate electrodes 7a and the gate electrodes 7b are formed by deposition of the same conductive material. The gate electrodes 7a and the gate electrodes 7b are formed by deposition of polysilicon, for example. After polysilicon is deposited on the entire first main surface S1, unnecessary polysilicon is removed by etching. The polysilicon left inside the trenches 5a becomes the gate electrodes 7a, and the polysilicon left inside the trenches 5b and the trench 5c becomes the gate electrodes 7b. Further, unnecessary part of the oxide film is removed so that the oxide films left inside the trenches 5a become the gate insulating films 6a, and the oxide films left inside the trenches 5b and the trench 5c become the gate insulating films 6b.

FIG. 8C is a diagram showing the state where the interlayer insulating film deposition step has been completed. The interlayer insulating film forming step is a step of forming interlayer insulating films 17 serving as an insulator on the gate electrodes 7a. The interlayer insulating films 17 are oxide films formed by, for example, chemical vapor deposition (CVD). The oxide films formed on portions of the first main surface S1 other than the gate electrodes 7a are removed by etching, for example.

Figure 9:
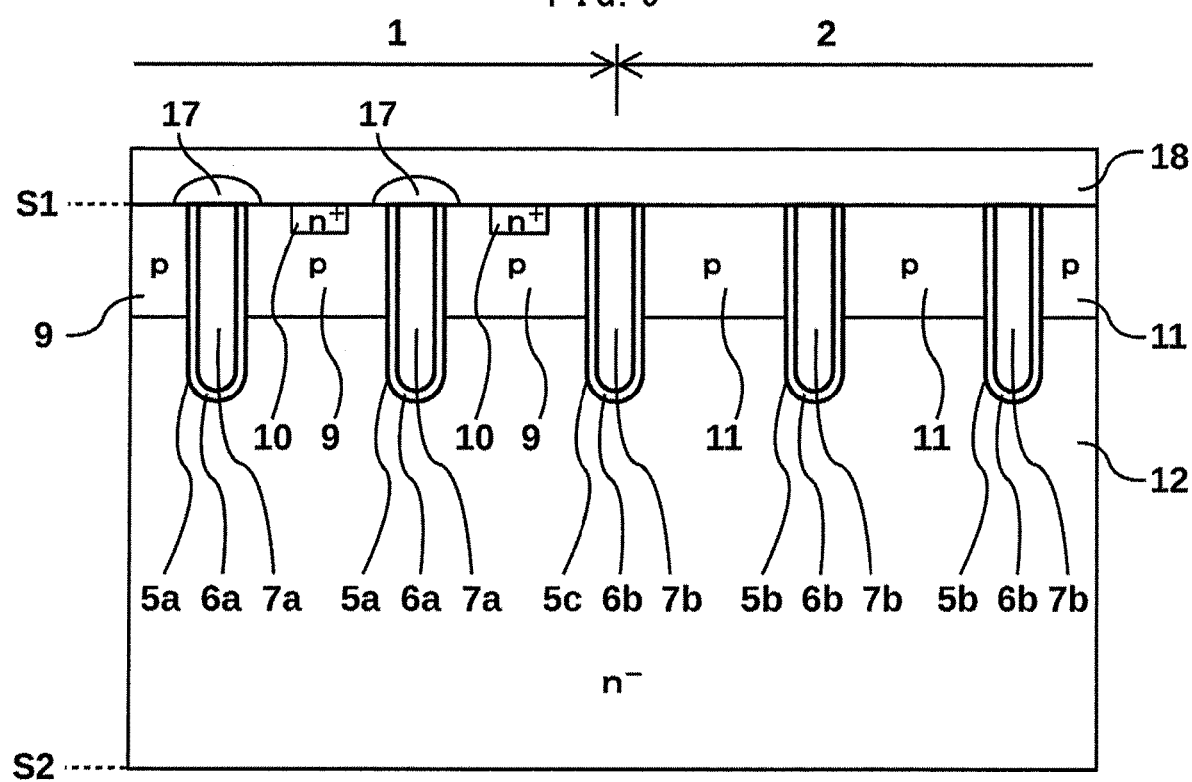
FIG. 9 is a diagram showing a process for manufacturing the semiconductor device according to the first embodiment.

FIG. 9 is a diagram showing the state where the first electrode forming step has been completed. The first electrode forming step is a step of forming the first electrode 18. The first electrode 18 is formed by sputtering metal from the first main surface S1 side, for example. Aluminum, for example, is used as the metal. The sputtering forms the first electrode 18 that covers the interlayer insulating films 17 and the first main surface S1.

Figure 10A:
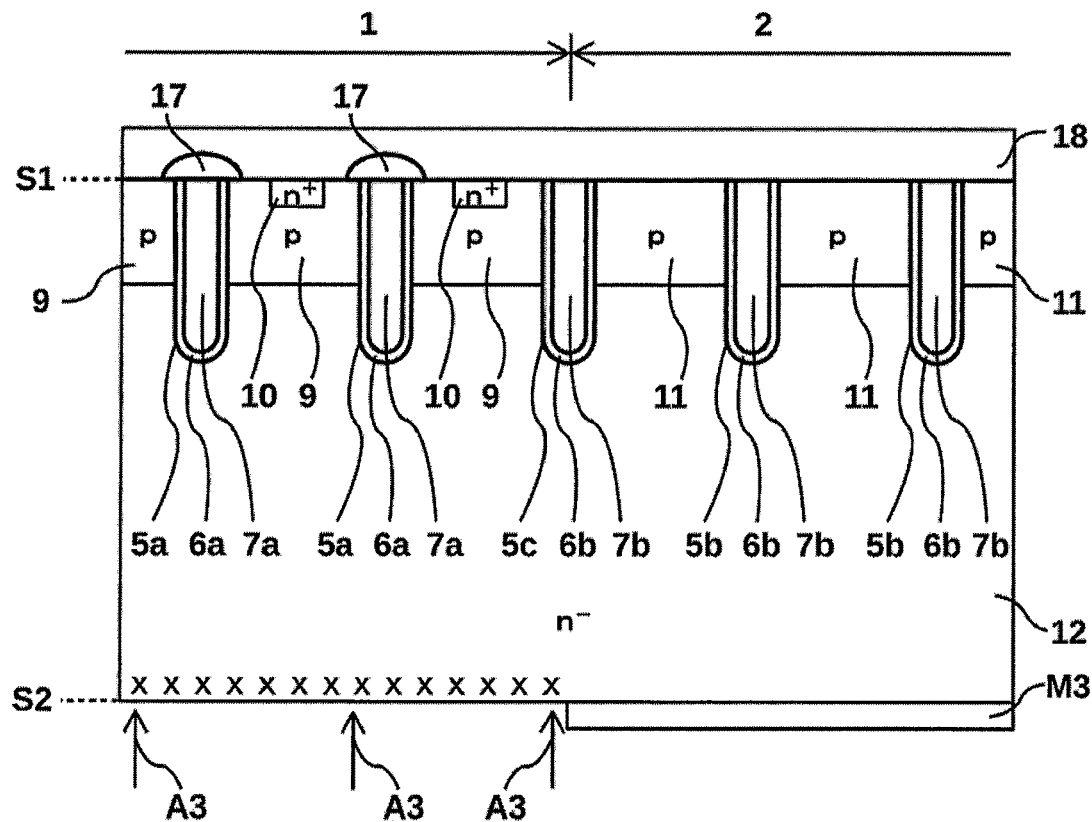
FIG. 10A is a diagram showing a process for manufacturing the semiconductor device according to the first embodiment.
Figure 10B:
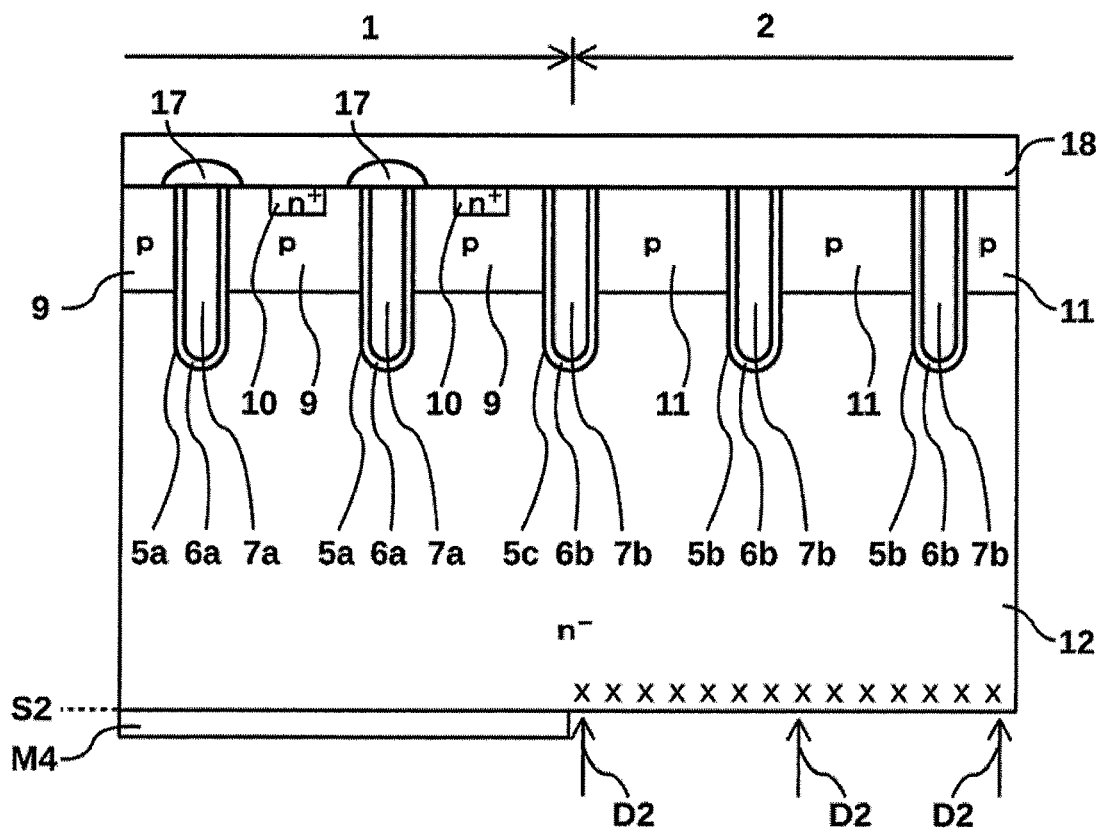
FIG. 10B is a diagram showing a process for manufacturing the semiconductor device according to the first embodiment.

FIGS. 10A and 10B are diagrams showing the manufacturing process in the second main surface side semiconductor layer forming step.

FIG. 10A is a diagram showing the manufacturing process in the second main surface side p-type semiconductor layer forming step. The second main surface side p-type semiconductor layer forming step is a step of forming a collector layer 13. The collector layer 13 is formed by injecting an acceptor A3 from the second main surface S2 side. The acceptor A3 is, for example, boron or aluminum. The acceptor A3 for the collector layer 13 can be the same as either or both of the acceptor A1 for the base layer 9 and the acceptor A2 for the anode layer 11. When these acceptors are the same, work for switching between acceptors can be reduced. A second main surface side acceptor injection mask M3 may be used on the second main surface S2 of the diode region 2 in which the acceptor A3 is not injected. The second main surface side acceptor injection mask M3 is formed, for example, by applying a resist on the second main surface S2, and is removed after the acceptor A3 is injected. The injected acceptor A3 is diffused by heating, thereby forming the collector layer 13.

FIG. 10B is a diagram showing the manufacturing process in the second main surface side n-type semiconductor layer forming step. The second main surface side n-type semiconductor layer forming step is a step of forming the cathode layer 15. The cathode layer 15 is formed by injecting a donor D2 from the second main surface S2 side. Arsenic, phosphorus, or the like is used as the donor D2. The donor D2 for the cathode layer 15 can be the same as either or both of the donor for the emitter layer 8 and the donor for the carrier injection suppression layer 10. When these donors are the same, work for switching between donors can be reduced.

A second main surface side donor injection mask M4 may be used on the second main surface S2 of the insulated gate bipolar transistor region 1 in which the donor D2 is not injected. The second main surface side donor injection mask M4 is formed, for example, by applying a resist on the second main surface S2, and is removed after the donor D2 is injected. The injected donor D2 is diffused by heating, thereby forming the cathode layer 15. Although the cathode layer 15 is formed after the collector layer 13 is formed, the order of formation is not limited to this. For example, the collector layer 13 may be formed after the cathode layer 15 is formed. The acceptor A3 and the donor D2 may be concurrently heated and diffused.

The second electrode forming step (not shown in the drawing) is a step of forming the second electrode 19. The second electrode 19 is formed by sputtering metal from the second main surface S2 side, for example. Aluminum, for example, is used as the metal. The sputtering forms the second electrode 19 that covers the second main surface S2. The semiconductor device 100 shown in FIG. 1 is obtained through the aforementioned steps.

Figure 11:
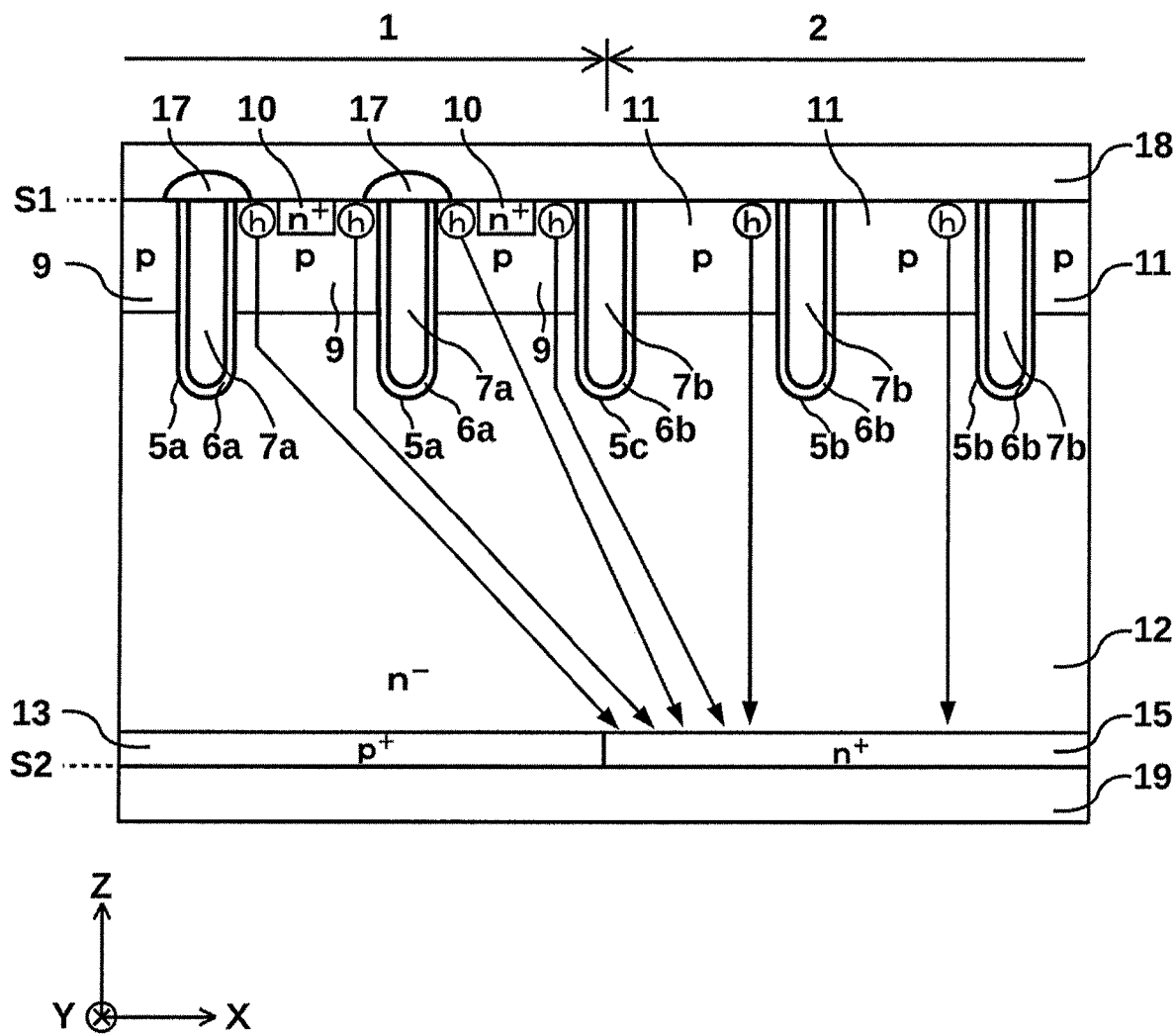
FIG. 11 is a diagram schematically showing the movement of holes during the diode operation in the semiconductor device according to the first embodiment.

The diode operation in the semiconductor device according to the first embodiment will now be explained. FIG. 11 is a diagram schematically showing the movement of holes during the diode operation in the semiconductor device according to the first embodiment. FIG. 11 is a diagram schematically showing the movement of holes during the diode operation in the cross-sectional view taken along line C-C shown in FIG. 2. During the diode operation, a positive voltage is applied to the first electrode 18 with respect to the second electrode 19. Application of a positive voltage allows holes h to be injected from the anode layer 11 and the base layer 9 into the drift layer 12, and the injected holes h move toward the cathode layer 15. Besides the holes h from the anode layer 11, the holes h from the insulated gate bipolar transistor region 1 flow into a portion of the diode region 2 that is near the boundary with the insulated gate bipolar transistor region 1, so that this portion has a higher density of holes h than that of a portion of the diode region 2 that is away from the insulated gate bipolar transistor region 1. During diode operation, circulating current flows in the direction from the first electrode 18 toward the second electrode 19.

Figure 12:
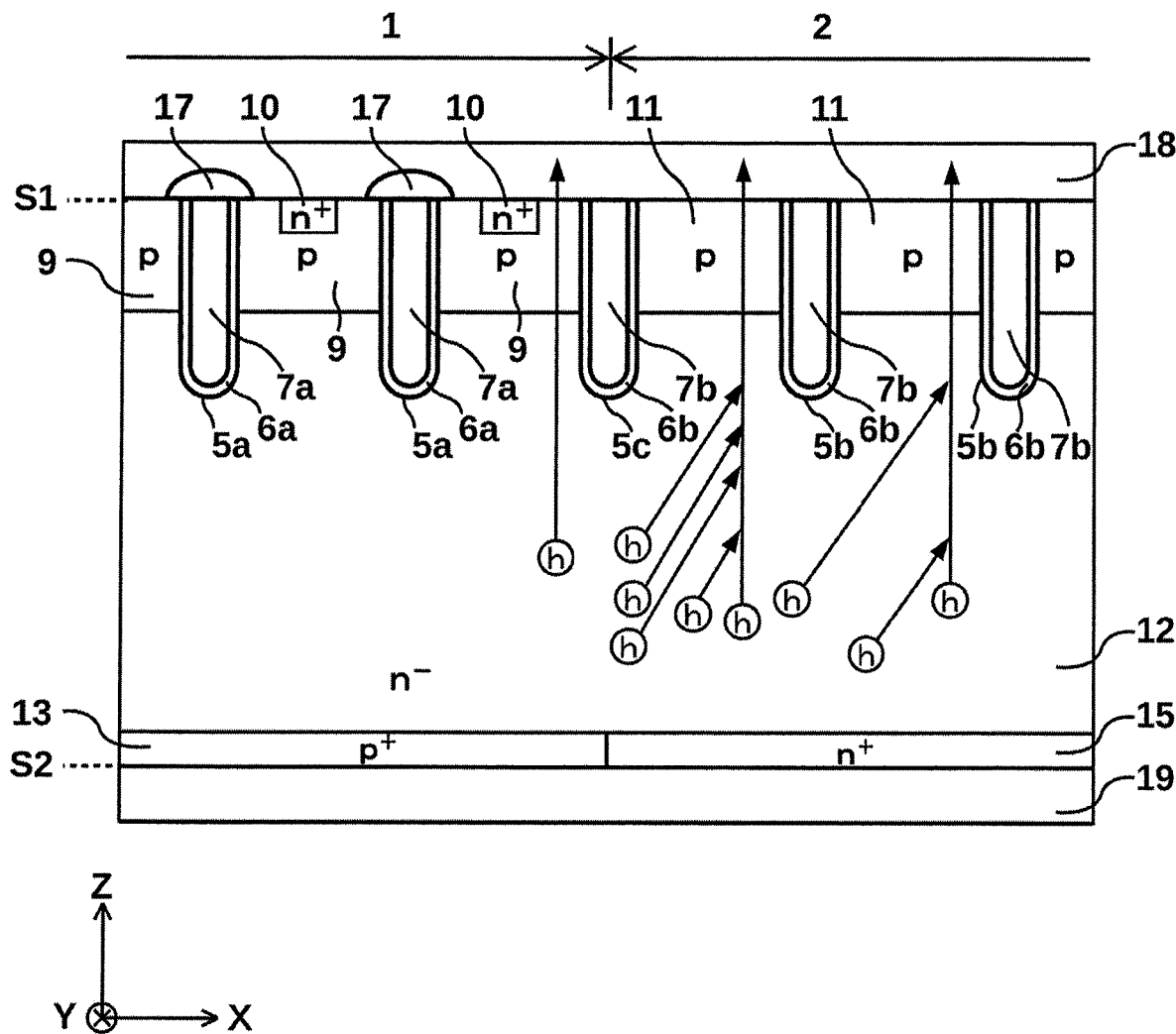
FIG. 12 is a diagram schematically showing the movement of holes during the recovery operation in the semiconductor device according to the first embodiment.

The recovery operation in the semiconductor device according to the first embodiment will now be explained. FIG. 12 is a diagram schematically showing the movement of holes during the recovery operation in the semiconductor device according to the first embodiment. FIG. 12 is a diagram schematically showing the movement of holes during the recovery operation in the cross-sectional view taken along line C-C shown in FIG. 2. During the recovery operation, a negative voltage is applied to the first electrode 18 with respect to the second electrode 19. The holes h moving toward the cathode layer 15 during the diode operation change their moving direction to the direction toward the anode layers 11. During the recovery operation, the holes h flow out of the semiconductor device via the anode layers 11 and the first electrode 18.

More holes h pass through the anode layers 11 in the diode region 2 near the boundary with the insulated gate bipolar transistor region 1 where the density of holes h is high during diode operation than through the anode layers 11 in the diode region 2 away from the insulated gate bipolar transistor region 1. Further, some of the holes h present in the insulated gate bipolar transistor region 1 flow out of the semiconductor device via the base layers 9 and the first electrode 18. During the recovery operation, a recovery current flows in the direction from the second electrode 19 toward the first electrode 18.

The effect of suppressing hole injection in the semiconductor device according to the first embodiment will be explained with reference to FIG. 11.

The semiconductor device according to the first embodiment suppresses the holes h flowing from the insulated gate bipolar transistor region 1 into the diode region 2. As shown in FIG. 11, during the diode operation, holes h are injected from the p-type base layers 9 into the drift layer 12 in the diode region 2. In contrast, holes h are not injected from the n-type carrier injection suppression layers 10 into the drift layer 12 in the diode region 2. Accordingly, when the carrier injection suppression layer 10 is provided, the injection of holes h from the insulated gate bipolar transistor region 1 to the diode region 2 during the diode operation can be suppressed compared with when the carrier injection suppression layer 10 is not provided.

Therefore, the recovery current can be suppressed and the breakdown resistance during the recovery operation can be enhanced by selectively providing the carrier injection suppression layers 10 in the surface layer of the base layers 9.

In the semiconductor device according to the first embodiment, as shown in FIG. 2, the width W2 of the carrier injection suppression layer 10 in the X direction is narrower than the width W1 of the emitter layer 8 in the Y direction. With the width W2 of the carrier injection suppression layer 10 like this, a voltage drop generated at the interface between the carrier injection suppression layer 10 and the base layer 9 can be made equal to or lower than a voltage drop generated at the interface between the emitter layer 8 and the base layer 9, thereby making the latch-up tolerance at the junction between the carrier injection suppression layer 10 and the base layer 9 higher than the latch-up tolerance at the junction between the emitter layer 8 and the base layer 9.

Although the first embodiment shows the structure in which the gate electrodes 7a are located in all the trenches 5a, when the amount of heat generated per unit area of the insulated gate bipolar transistor region 1 during energization is large, the gate electrodes 7a should not necessarily be located in all the trenches 5a in the insulated gate bipolar transistor region 1, and a so-called thinning structure in which gate electrodes 7b electrically connected to the first electrode 18 are located in some of the multiple trenches located in the insulated gate bipolar transistor region 1 may be adopted instead.

In addition, although the structure in which the gate electrode 7b is located in the trench located at the boundary between the insulated gate bipolar transistor region 1 and the diode region 2 is shown, the gate electrode 7a electrically connected to the gate signal receiving region 3 may be formed in the trench 5c.

Second Embodiment

Figure 13:
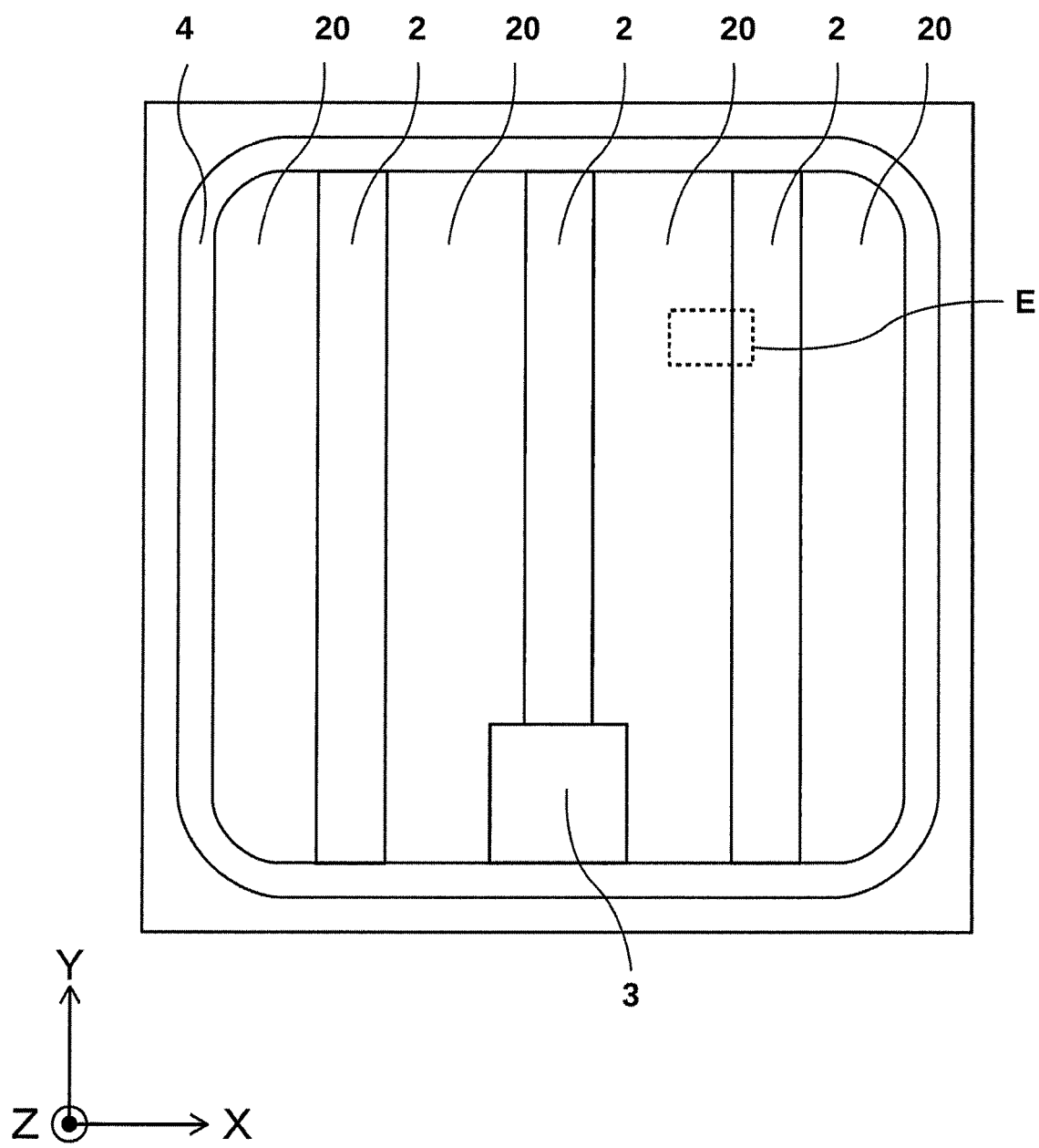
FIG. 13 is a plan view showing the semiconductor device according to a second embodiment.
Figure 14:
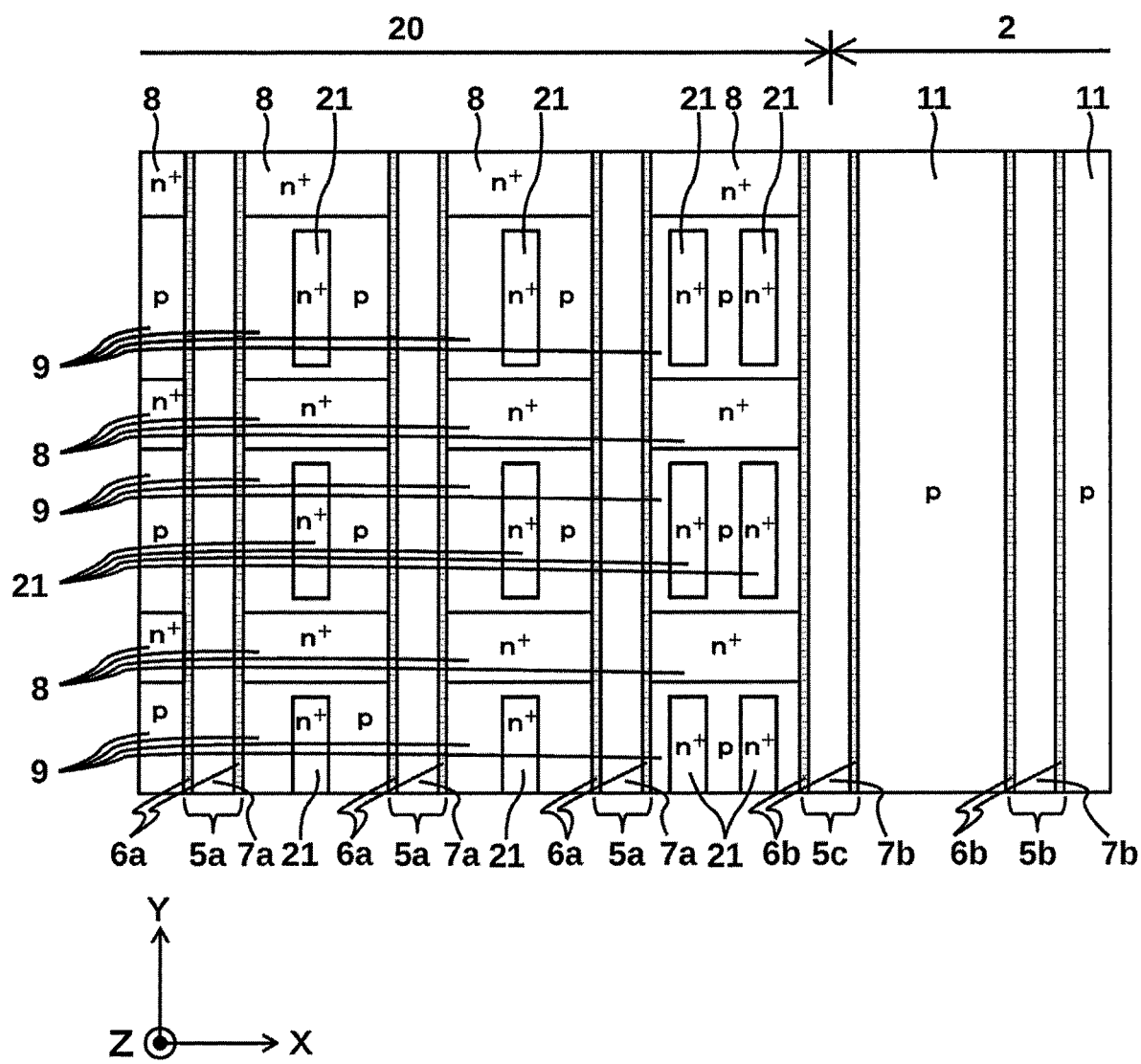
FIG. 14 is a plan view showing the semiconductor device according to the second embodiment.

The configuration of a semiconductor device according to a second embodiment will be described with reference to FIGS. 13 and 14. FIGS. 13 and 14 are plan views showing the semiconductor device according to the second embodiment. FIG. 14 is an enlarged view of the portion E shown in FIG. 13, and is a plan view showing the configuration of the first main surface side of the semiconductor substrate. FIG. 14 does not show electrodes and other components provided above the first main surface of the semiconductor substrate. FIGS. 13 and 14 also show XYZ orthogonal coordinate axes indicating directions for convenience of explanation. It should be noted that in the second embodiment, the same components as those described in the first embodiment will be denoted by the same reference numerals and the description thereof will be omitted.

As shown in FIG. 13, in a semiconductor device 200 according to the second embodiment, an insulated gate bipolar transistor region 20 and the diode region 2 are repeatedly aligned in the X direction of the semiconductor device 200.

As shown in FIG. 14, in the semiconductor device according to the second embodiment, the carrier injection suppression layers 21 located between the adjacent gate electrodes 7a or between the adjacent gate electrodes 7a and 7b cover a larger area toward the diode region 2 in a plan view.

In FIG. 14, all the multiple carrier injection suppression layers 21 have the same area. In a plan view, comparison of the proportions of the areas of the carrier injection suppression layers 21 located between the adjacent gate electrodes 7a or between the gate electrodes 7a and 7b in the insulated gate bipolar transistor region 1 shows that the proportions of the areas of the carrier injection suppression layers 21 between the gate electrode 7b that is the gate electrode closest to the diode region 2 and the adjacent gate electrode 7a is twice the area of the carrier injection suppression layers 21 between the adjacent gate electrodes 7a.

In general, the number of holes flowing from the insulated gate bipolar transistor region into the diode region during the recovery operation increases toward the diode region.

In the semiconductor device according to the second embodiment, the proportions of the areas of the carrier injection suppression layers 21 located between the adjacent gate electrodes 7a or between the gate electrodes 7a and 7b increases toward the diode region 2. Therefore, the inflow of holes from the insulated gate bipolar transistor region 20 to the diode region 2 can be suppressed more efficiently and the breakdown resistance during the recovery operation can be enhanced. On the other hand, in the portion of the insulated gate bipolar transistor region 20 apart from the diode region 2, the risk of latch-up that occurs just below the carrier injection suppression layer 21 upon switching to the non-conducting state can be reduced.

The carrier injection suppression layers 21 are sandwiched between the base layers 9, and are not in contact with the gate insulating films 6a. The carrier injection suppression layers 21 are semiconductor layers that do not contribute to switching between the conducting state and the non-conducting state of the insulated gate bipolar transistor region 20. Consequently, unbalanced current in the insulated gate bipolar transistor region 20 is suppressed even in the case where the proportions of the areas of the carrier injection suppression layers 21 located between the adjacent gate electrodes 7a or gate electrodes 7a and 7b are configured to increase toward the diode region 2.

The second embodiment has showed the example in which all the multiple carrier injection suppression layers 21 have the same area and the number of carrier injection suppression layers 21 located between the adjacent gate electrodes 7a or between the gate electrodes 7a and 7b increases toward the diode region 2 so that the proportions of the areas of the carrier injection suppression layers 21 located between the adjacent gate electrodes 7a or between the gate electrodes 7a and 7b are configured to increase toward the diode region 2. Alternatively, the same number of carrier injection suppression layers 21 may be located between the adjacent gate electrodes 7a or between the gate electrodes 7a and 7b, and the areas of the carrier injection suppression layers 21 may increase toward the diode region 2 so that the proportions of the areas of the carrier injection suppression layers 21 located between the adjacent gate electrodes 7a or between the gate electrodes 7a and 7b may increase toward the diode region 2.

Third Embodiment

Figure 15:
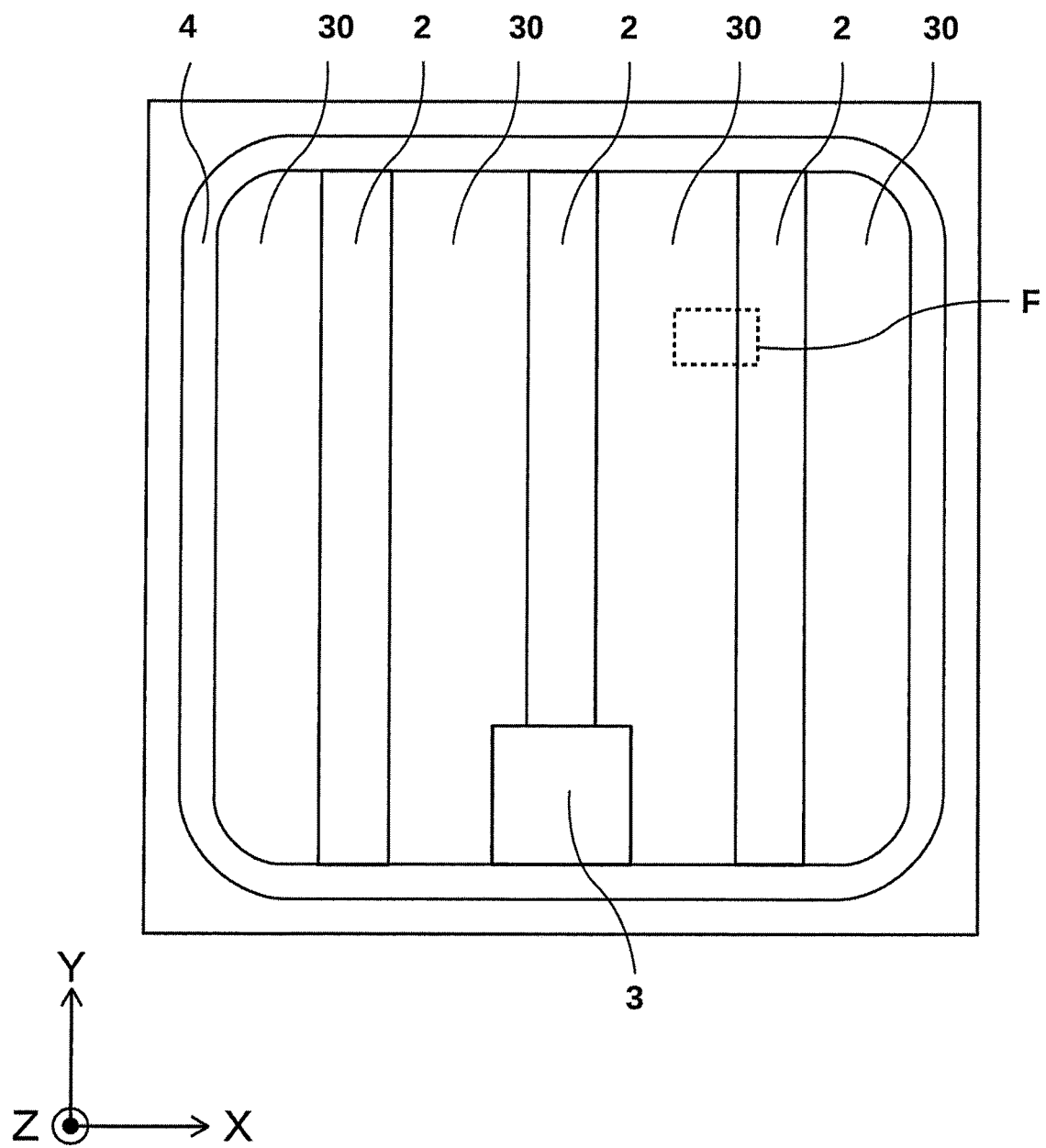
FIG. 15 is a plan view showing the semiconductor device according to the second embodiment.

The configuration of a semiconductor device according to a third embodiment will be described with reference to FIGS. 15 and 16. FIGS. 15 and 16 are plan views showing the semiconductor device according to the third embodiment. FIG. 16 is an enlarged view of the portion F shown in FIG. 15, and is a plan view showing the configuration of the first main surface side of the semiconductor substrate. FIG. 16 does not show electrodes and other components provided above the first main surface of the semiconductor substrate. FIGS. 15 and 16 also show XYZ orthogonal coordinate axes indicating directions for convenience of explanation. It should be noted that in the third embodiment, the same components as those described in the first and second embodiments will be denoted by the same reference numerals and description thereof will be omitted.

As shown in FIG. 15, in a semiconductor device 300 according to the third embodiment, an insulated gate bipolar transistor region 30 and the diode region 2 are repeatedly provided in the X direction of the semiconductor device 300.

As shown in FIG. 16, the semiconductor device 300 according to the third embodiment has the insulated gate bipolar transistor region 30. The insulated gate bipolar transistor region has a first region 30a in which carrier injection suppression layers 31 are provided between the adjacent gate electrodes 7a or 7b, and a second region 30b in which no carrier injection suppression layer 31 is provided between the adjacent gate electrodes 7a or 7b. The first region is located closer to the diode region 2 than the second region 30b.

In the semiconductor device according to the third embodiment, the first region 30a provided with the carrier injection suppression layer 31 is located closer to the diode region 2 than the second region 30b provided with no carrier injection suppression layer 31. Consequently, the inflow of holes from the insulated gate bipolar transistor region 30 to the diode region 2 can be suppressed efficiently and the breakdown resistance during the recovery operation can be enhanced. On the other hand, since the second region 30b is located in the portion of the insulated gate bipolar transistor region 30 further from the diode region 2 than the first region 30a, and no carrier injection suppression layer 31 is provided in the second region 30b, the risk of latch-up that occurs when the insulated gate bipolar transistor region 30 switches to the non-conducting state can be suppressed.

The carrier injection suppression layer 31 is in contact with the emitter layer 8 in the Y direction. Such a structure can increase the area of the carrier injection suppression layers 31, thereby suppressing the holes flowing into the diode region 2 and enhancing the breakdown resistance during the recovery operation.

Although the first to third embodiments show the structure in which the base layer is a single layer, this is not necessarily the case and the base layer may have a structure of two layers of the same conductivity type. For example, when the contact resistance of a contact portion between a base layer and a first electrode is significant, the contact resistance of the contact portion between the base layer and the first electrode can be reduced by adopting a two-layer structure having a high-concentration base layer having a high acceptor concentration on the first main surface side of the base layer, and a low-concentration base layer having a lower acceptor concentration than the high-concentration base layer on the second main surface side with respect to the high-concentration base layer. Similarly, when the contact resistance of a contact portion between an anode layer and a first electrode is significant, the contact resistance of the contact portion between the anode layer and the first electrode can be reduced by adopting a two-layer structure having a high-concentration anode layer having a high acceptor concentration on the first main surface side of the anode layer, and a low-concentration anode layer having a lower acceptor concentration than the high-concentration anode layer on the second main surface side in the anode layer.

Some embodiments of the present disclosure, which have been described above, have been presented as examples. Various omissions, replacements, and modifications can be made without departing from the spirit thereof. Further, these embodiments can be combined.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-056272, filed on Mar. 26, 2020 including specification, claims, drawings and summary, on which the convention priority of the present application is based, is incorporated herein by reference in its entirety.

The invention claimed is:

1. A semiconductor device comprising:
a semiconductor substrate having a drift layer of a first conductive type between a first main surface and a second main surface opposite to the first main surface; and
an insulated gate bipolar transistor region and a diode region provided on the semiconductor substrate and adjacent to each other, wherein
the insulated gate bipolar transistor region includes
base layers of a second conductive type provided in a surface layer of the semiconductor substrate on a first main surface side,
emitter layers of the first conductive type selectively provided in a surface layer of the base layer on the first main surface side,
multiple gate electrodes provided on the first main surface side of the semiconductor substrate, aligned in a first direction extending along the first main surface, and facing the emitter layer, the base layer, and the drift layer via a gate insulating film,
carrier injection suppression layers of the first conductive type selectively provided in the surface layer of the base layer on the first main surface side and sandwiched by the base layers in the first direction between a first pair of the gate electrodes adjacent to each other in the first direction, each carrier injection suppression layer having a respective bottom surface that is opposite to the first main surface of the semiconductor substrate, and the respective bottom surface of each carrier injection suppression layer is in direct contact with one of the base layers, and
a collector layer of the second conductive type provided in a surface layer of the semiconductor substrate on the second main surface side,
the diode region includes
an anode layer of the second conductive type provided in the surface layer of the semiconductor substrate on the first main surface side, and
a cathode layer of the first conductive type provided in a second surface layer of the semiconductor substrate on the second main surface side,
the insulated gate bipolar transistor region further includes
a second pair of the gate electrodes adjacent to one another,
a first region between the first pair of adjacent gate electrodes and including the carrier injection suppression layers,
a second region between the second pair of gate electrodes and including plural of the base and emitter layers but no carrier injection suppression layer, and
the first region is located closer to the diode region than the second region.

2. The semiconductor device according to claim 1, wherein
the carrier injection suppression layers are each sandwiched by two of the emitter layers in a second direction orthogonal to the first direction and extending along the first main surface.

3. The semiconductor device according to claim 1, wherein
the emitter layers are each in contact with one of the carrier injection suppression layers in a second direction orthogonal to the first direction and extending along the first main surface.

4. The semiconductor device according to claim 1, wherein
the carrier injection suppression layers and the emitter layers longitudinally extend in a longitudinal direction and laterally extend in a lateral direction orthogonal to the longitudinal direction in a plan view, and
a width of the carrier injection suppression layers in the lateral direction is less than a width of the emitter layers in the lateral direction.

5. The semiconductor device according to claim 1, wherein
the emitter layers and the carrier injection suppression layers have same first conductivity type impurities.

6. The semiconductor device according to claim 1, wherein
the base layers include a high-concentration base layer on the first main surface side, and a low-concentration base layer having a lower concentration than the high-concentration base layer and provided on the second main surface side of the high-concentration base layer.

7. The semiconductor device according to claim 1, wherein
the anode layer includes a high-concentration anode layer on the first main surface side, and a low-concentration anode layer having a lower concentration than the high-concentration anode layer and provided on the second main surface side of the high-concentration anode layer.

8. The semiconductor device according to claim 1, wherein
an impurity concentration of the carrier injection suppression layers and an impurity concentration of the emitter layers is each greater than or equal to $1E17$ $cm^{-3}$ and less than or equal to $1E20$ $cm^{-3}$.

9. The semiconductor device according to claim 1, wherein
no carrier injection suppression layers are formed in the diode area.

10. A semiconductor device comprising:
a semiconductor substrate having a drift layer of a first conductive type between a first main surface and a second main surface opposite to the first main surface; and
an insulated gate bipolar transistor region and a diode region provided on the semiconductor substrate and adjacent to each other, wherein
the insulated gate bipolar transistor region includes
base layers of a second conductive type provided in a surface layer of the semiconductor substrate on a first main surface side,
emitter layers of the first conductive type selectively provided in a surface layer of the base layer on the first main surface side,
multiple gate electrodes provided on the first main surface side of the semiconductor substrate, aligned in a first direction extending along the first main surface, and facing the emitter layer, the base layer, and the drift layer via a gate insulating film,
carrier injection suppression layers of the first conductive type selectively provided in the surface layer of the base layer on the first main surface side and sandwiched by the base layers in the first direction between a first pair of the gate electrodes adjacent to each other in the first direction, each carrier injection suppression layer having a respective bottom surface that is opposite to the first main surface of the semiconductor substrate, and the respective bottom surface of each carrier injection suppression layer is in direct contact with one of the base layers, and a collector layer of the second conductive type provided in a surface layer of the semiconductor substrate on the second main surface side, the diode region includes an anode layer of the second conductive type provided in the surface layer of the semiconductor substrate on the first main surface side, and a cathode layer of the first conductive type provided in a second surface layer of the semiconductor substrate on the second main surface side, and the insulated gate bipolar transistor region further includes a second pair of the gate electrodes adjacent to one another, a first region between the first pair of adjacent gate electrodes and including the carrier injection suppression layers, the first region being adjacent to the diode region in the first direction, and a second region between the second pair of gate electrodes and including plural of the base and emitter layers, the second region being separated from the diode region in the first direction and including no carrier injection suppression.

\* \* \* \* \*